(12) United States Patent
Leigh et al.

(10) Patent No.: US 12,704,887 B2
(45) Date of Patent: Aug. 11, 2026

(54) MULTI-ROW PLUGGABLE HIGH-RADIX MODULES

(71) Applicant: HEWLETT PACKARD ENTERPRISE DEVELOPMENT LP, Spring, TX (US)

(72) Inventors: Kevin B. Leigh, Houston, TX (US); John Norton, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 852 days.

(21) Appl. No.: 18/060,310

(22) Filed: Nov. 30, 2022

(65) Prior Publication Data

US 2023/0085909 A1 Mar. 23, 2023

Related U.S. Application Data

(62) Division of application No. 17/175,005, filed on Feb. 12, 2021, now Pat. No. 11,531,382.

(51) Int. Cl.
*G06F 1/186* (2026.01)
*G06F 1/185* (2026.01)
(Continued)

(52) U.S. Cl.
CPC .............. *G06F 1/186* (2013.01); *G06F 1/185* (2013.01); *H05K 7/1431* (2013.01); *H01R 43/205* (2013.01)

(58) Field of Classification Search
CPC .......... G06F 1/186; G06F 1/185; G06F 1/187; H05K 7/1431; H05K 7/1487; H01R 43/205
See application file for complete search history.

(56) References Cited

U.S. PATENT DOCUMENTS 5,926,370 A * 7/1999 Cromwell ................. G06F 1/18 257/713
6,354,844 B1 * 3/2002 Coico .................... H05K 3/325 439/74

(Continued)

FOREIGN PATENT DOCUMENTS

EP 3537308 A1 * 9/2019 ........... H05K 7/1452
EP 3617836 B1 * 3/2021 ........... H05K 5/0286

OTHER PUBLICATIONS

Gala Systems Inc., "Spiralift Technology for platform elevator, stage, orchestra and piano", available online at <https://web.archive.org/web/20201201055816/https://www.galasystems.com/en/spiralift/>, Dec. 1, 2020, 4 pages.

(Continued)

*Primary Examiner* — Jeffrey T Carley
(74) *Attorney, Agent, or Firm* — Hewlett Packard Enterprise Patent Department

(57) ABSTRACT

A computing system comprises a module cage for containing a system board and a plurality of pluggable modules, the module cage having a front face, the pluggable modules arranged in at least two rows of pluggable module locations extending parallel to the front face within the module cage. A layered module locking system including a sliding front locking handle and a sliding rear locking handle is provided. the sliding rear locking handle extending beneath the front locking handle. The sliding locking handles each includes at least one locking feature for slidably engaging with at least one foot of a pluggable module.

8 Claims, 18 Drawing Sheets

(51) Int. Cl.
*H05K 7/14* (2006.01)
*H01R 43/20* (2006.01)

(56) References Cited

U.S. PATENT DOCUMENTS 6,618,270 B2 * 9/2003 Babin .................... H05K 9/002 174/382
7,052,306 B2 5/2006 Ishigami et al.
7,659,736 B2 2/2010 Eldridge et al.
7,690,944 B2 4/2010 Matsumura et al.
8,760,870 B2 6/2014 Yamamoto
9,001,515 B2 4/2015 Tang et al.
9,304,274 B2 4/2016 Mccolloch
9,433,119 B2 8/2016 Canfield et al.
9,455,510 B2 * 9/2016 Busch .................. H05K 7/1469
9,666,997 B1 5/2017 Henry et al.
9,671,582 B2 6/2017 Yeh et al.
9,690,064 B2 6/2017 Sauter et al.
9,730,339 B2 * 8/2017 Burke .................... B64G 1/425
9,935,403 B1 4/2018 Briant et al.
10,276,995 B2 4/2019 Little
10,288,824 B2 5/2019 Lin
10,398,050 B2 8/2019 Tracy et al.
10,468,794 B2 11/2019 Leigh et al.
10,534,138 B2 1/2020 Leigh et al.
10,539,753 B1 1/2020 Leigh et al.
10,651,607 B1 5/2020 Gawlowski
10,680,388 B2 6/2020 Champion et al.
10,681,832 B1 6/2020 Leigh et al.
10,707,602 B2 7/2020 Leigh et al.
10,916,887 B2 2/2021 Chan
10,939,594 B2 3/2021 Long et al.
10,973,157 B2 * 4/2021 Elsasser ............... H05K 9/0062
11,011,861 B1 5/2021 Briant et al.
11,098,738 B2 8/2021 Lu et al.
11,297,728 B1 4/2022 Shang et al.
11,340,411 B2 5/2022 Wang et al.
11,349,236 B2 5/2022 Costello et al.
11,404,829 B2 8/2022 Kumar et al.
11,945,652 B2 * 4/2024 Shultz .................. B65G 1/1371
12,325,592 B2 * 6/2025 Shultz ................ G06Q 10/0832
12,342,491 B2 * 6/2025 Yang .................... H05K 7/1489
2008/0310095 A1 * 12/2008 Chiang .................. H05K 7/023 361/725
2009/0168341 A1 * 7/2009 Zhang ..................... G06F 1/186 361/679.58
2010/0254096 A1 * 10/2010 Kim ........................ G06F 1/185 361/737
2013/0012052 A1 * 1/2013 Lee ...................... G02B 6/4201 439/345
2013/0141860 A1 * 6/2013 Zhou ....................... G06F 1/185 403/374.2
2014/0111931 A1 * 4/2014 Casserly ............ H05K 13/0486 361/752
2019/0146167 A1 5/2019 Leigh et al.
2019/0215989 A1 7/2019 Su et al.
2020/0260615 A1 * 8/2020 Leigh .................... H01L 23/427
2020/0295483 A1 9/2020 Costello et al.
2020/0367387 A1 * 11/2020 Selvidge ............ H05K 7/20772
2021/0149133 A1 5/2021 Kuramochi
2021/0357004 A1 11/2021 Liu et al.
2022/0091350 A1 3/2022 Lin et al.
2023/0261410 A1 * 8/2023 Yow ................... H01R 13/4534 439/137
2024/0306335 A1 * 9/2024 Yang .................... H05K 7/1489

OTHER PUBLICATIONS

Hexbug, “Vex Robotics Screw Lift Ball Machine”, available online at <https://www.hexbug.com/vex-robotics-screw-lift-ball-machine.html?gclid=EAIaIQobChMI1p3o_Kba6QIVx0XVCh0Glg1uEAQYASABEgJfyPD_BwE>, 2021, 4 pages.

* cited by examiner 108
106
100-n
104
110
102-n
122
114-n
118
116-n
116-1
114-1
100-1
112
102-1
120

124

702
616
708
908
700
616
600*
1200
1204
1204
1206
600
900
904
910
704
912

702
700
616
708
600*
616
1200
1204
1204
1206
616
1308
616
1206
900
904
600
910
704
912
1202

702
700
616
708
600*
1200
616
1204
1204
616
1206
1310
1206
616
900
904
600
910
704
912

MULTI-ROW PLUGGABLE HIGH-RADIX MODULES

CROSS-REFERENCE TO RELATED APPLICATIONS

This application is a divisional of U.S. patent application Ser. No. 17/175,005, filed on Feb. 12, 2021, and now issued as U.S. Pat. No. 11,531,382, the entire contents of which are incorporated by reference herein.

BACKGROUND

Computing systems may include a system board with a number of receptacles such as socket connectors to couple pluggable modules to the system board. The pluggable modules may be transceiver modules or other types of integrated circuit (IC) modules. The pluggable modules may be used for network data communications or other computational needs of a computing device. The modules may be installed in receptacles on the system board, which may be a printed circuit board (PCB) of a computing device such as a switch module. A system board may be with a module cage having a faceplate where one or more connectors may be provided for coupling communication cables, such as fiber-optic cables to the pluggable modules. Other inter-system connections or peripheral device connections that provide communicative coupling to one or more pluggable modules may also be provided.

BRIEF DESCRIPTION OF THE DRAWINGS

The present disclosure is best understood from the following detailed description when read with the accompanying figures, wherein.

Figures 1A, 1B, 1C:
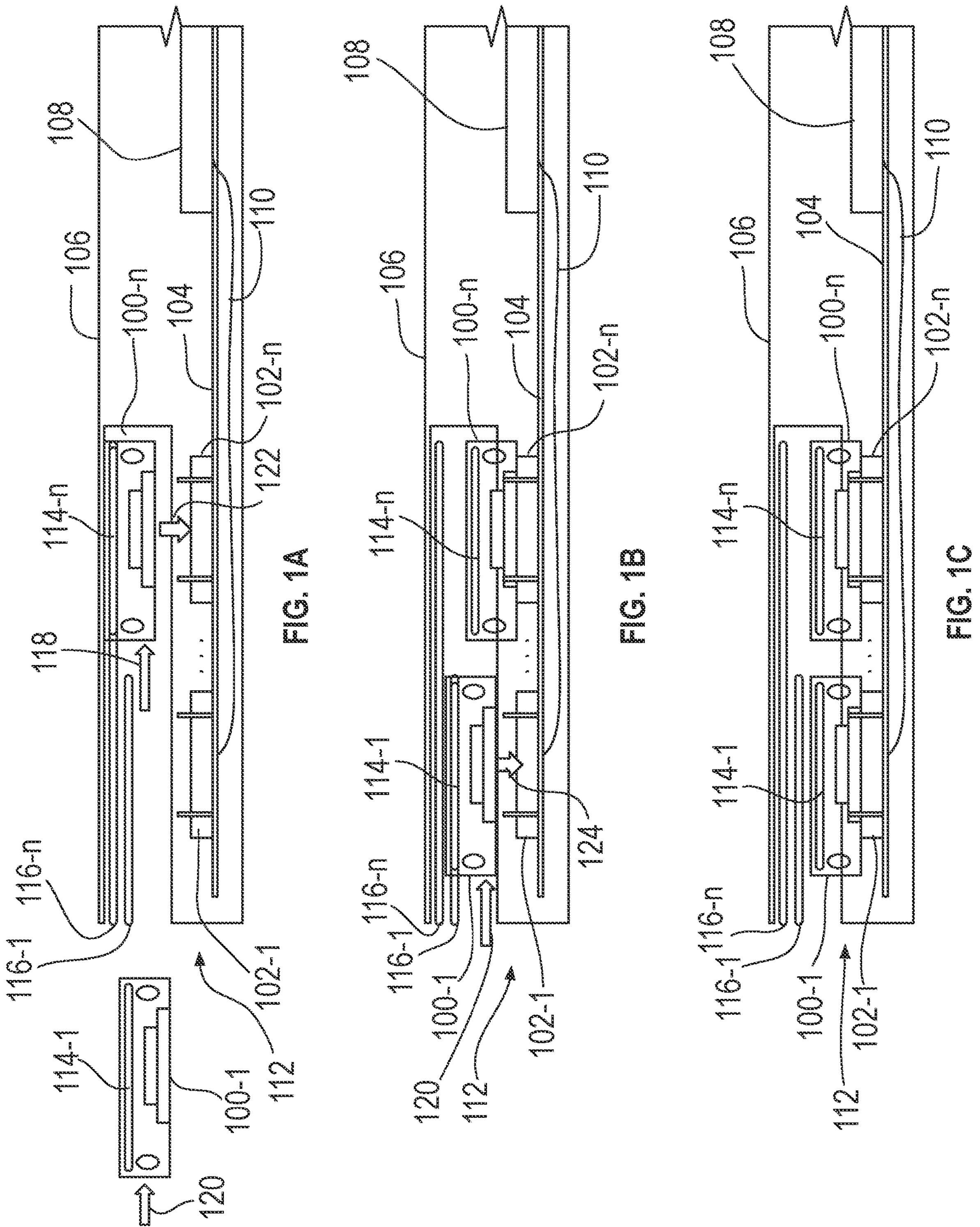
FIGS. 1A, 1B, and 1C are side views illustrating a sequence of installation of pluggable modules into receiving sockets on a system board in a lower-profile enclosure according to one or more examples.

It is emphasized that, in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

Examples of pluggable modules and methods for installing pluggable modules into receptacles on a system board in a module cage are described herein which include various mechanisms for installing (e.g., by "loading") pluggable modules onto a system board. In some examples, a horizontally advanced loader carrier bracket may allow for installing multiple rows of pluggable modules into each bay of a multi-bay module cage. In some examples, a leadscrew mechanism and a carrier assembly may facilitate mechanical coupling of a pluggable module to a system board. Communicative coupling may result based, at least in part, on the loading and mechanical coupling (e.g., using blind-mate connections completed via the loading process).

In various examples herein, pluggable modules may be arranged in multi-row bays within a module cage, each multi-row bay being accessible through a front face of the module cage, and pluggable modules may be installed. In these examples, the number of pluggable modules may not be limited by the immediate space behind a system faceplate. In some examples, a module may be separately installed or removed in any row of a multi-row bay without necessitating removal of pluggable modules which may be installed in front of the module being installed or removed. Further, in some examples, pluggable modules may be secured within any row of a multi-row bay with locking handles accessed at the front of the module cage.

FIGS. 1A, 1B, and 1C are side views illustrating a sequence of installation for a plurality of pluggable modules 100-1 . . . 100-*n* onto a plurality of receptacles 102-1 . . . 102-*n* arranged on a system board 104 in a module cage 106 according to one or more examples. In some examples, receptacles 102-1 . . . 102-*n* may be blind-mate sockets adapted to mate with blind-mate connectors on pluggable modules 100-1 . . . 100-*n*. A single bay of receptacles 102-1 . . . 102-*n* is shown in the side views of FIGS. 1A-1C, with receptacle 102-1 {in the example of FIG. 1A-1C) being at the front 112 of module cage 106. Module cage 106 may be a lower-profile cage, having a standard server rack configuration of one rack unit ("1U"), which may be 19 inches wide and 1.75 inches tall.

In FIGS. 1A-1C, system board 104 of module cage 106 defines the plurality of receptacles 102-1 . . . 102-*n* for pluggable modules 100-1 . . . 100-*n*, and may also support computing circuitry 108, which may include processing circuitry, memory circuitry, switching circuitry, routing circuitry, or some combination thereof. In examples, system board 104 may be a printed circuit board ("PCB") providing an electrical base layer ("EBL") schematically identified with reference numeral 110 in FIGS. 1A-1C for providing an electrical interface between computing circuitry 108 and pluggable modules 100-1 . . . 100-*n* via respective receptacles 102-1 . . . 102-*n*.

In the example of FIGS. 1A-1C, each pluggable module 100-1 . . . 100-*n* may include side flanges 114-1 . . . 114-*n*, respectively. Module cage 106 may include a plurality of guide channels 116-1 . . . 116-*n* for receiving respective side flanges 114-1 . . . 114-*n* to guide respective pluggable modules 100-1 . . . 100-*n* into module cage 106. Guide channels 116-1 . . . 116-*n* may be configured to assist in guiding respective pluggable modules 100-1 . . . 100-*n* to an appropriate location corresponding to respective receptacles 102-1 . . . 102-*n*. In FIG. 1A, pluggable module 101-*n* is installed first, with side flange 114-*n* being advanced though guide channel 116-*n* in the direction of arrow 118. Front pluggable module 100-1 is the last to be inserted, with side flange 114-1 being advance through guide channel 116-1 in the direction of arrow 120. In the example of FIGS. 1A-1C, front pluggable module 100-1 is illustrated to be installed last, in part, due to the height limitation of the 1U module cage 106.

As shown in FIG. 1A, when pluggable module 100-*n* is advanced to a location corresponding to receptacle 102-*n*, pluggable module 100-*n* may be lowered into place at receptacle 102-*n*, as indicated by arrow 122. Similarly, as shown in FIG. 18, when pluggable module 100-1 is advanced to a location corresponding to receptacle 102-1, pluggable module 100-1 may be lowered into place at receptacle 102-1, as indicated by arrow 124.

In the example of FIGS. 1A-1C, pluggable modules 102-1 . . . 102-*n* may be lowered into place at respective receptacles by various means, including mechanical means, electromagnetic systems, lead screw elevating systems, servo-motor systems, and the like, including various examples described hereinbelow.

Figures 2A, 2B, 2C:
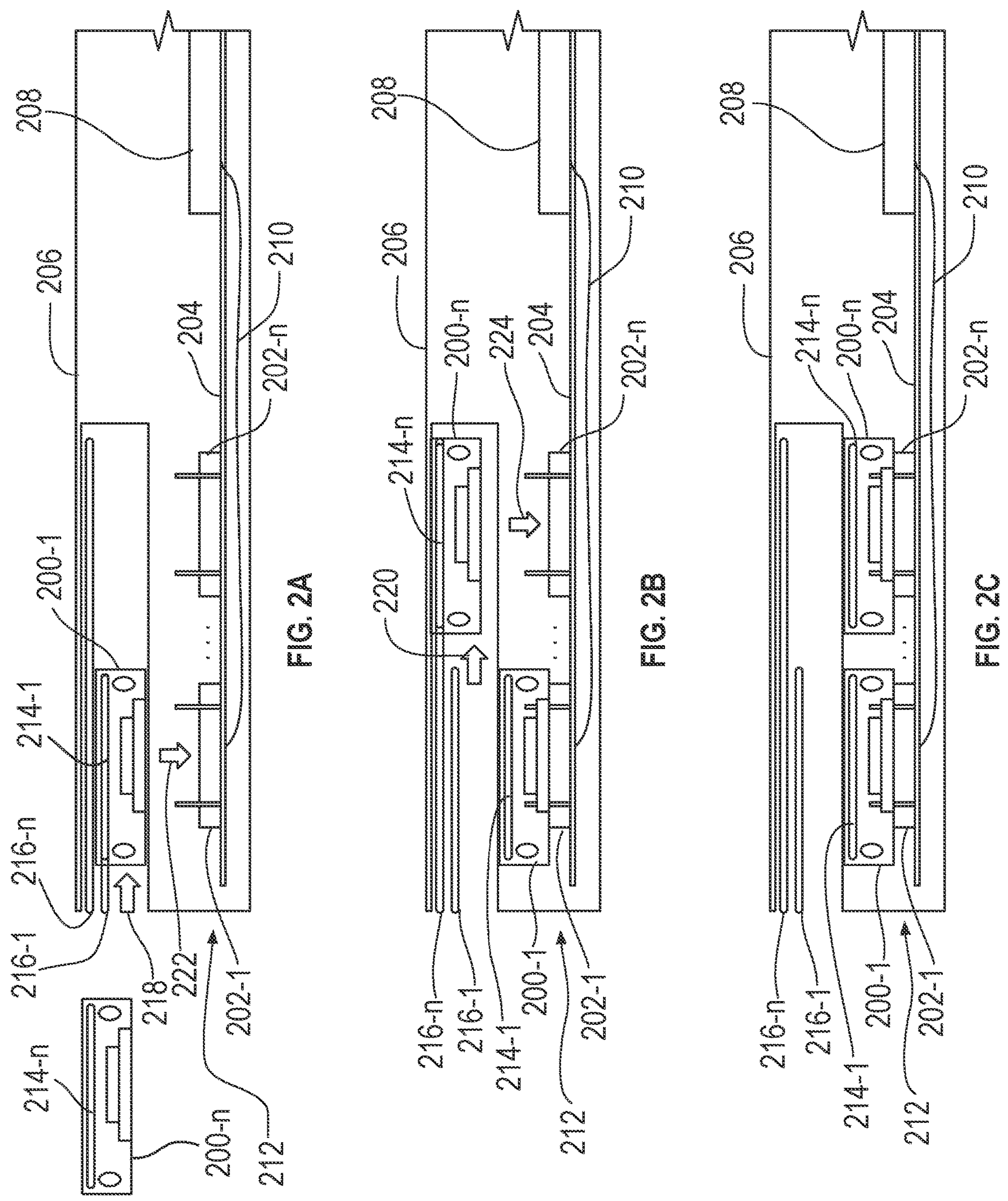
FIGS. 2A, 2B, and 2C are side views illustrating a sequence of installation of pluggable modules into receiving sockets on a system board in a higher-profile enclosure according to one or more examples.

FIGS. 2A, 2B, and 2C are side views of a sequence of installation of a plurality of pluggable modules 200-1 . . . 200-*n* onto a plurality of receptacles 202-1 . . . 202-*n* arranged on a system board 204 in a module cage 206 according to one or more examples. In some examples, receptacles 202-1 . . . 202-*n* may include blind-mate sockets adapted to mate with blind-mate connectors on pluggable modules 200-1 . . . 200-*n*. A single bay of receptacles 202-1 . . . 202-*n* is shown in the side views of FIGS. 1A-1C, with receptacle 202-1 in the example of FIG. 2A-2C, being at the front 212 of module cage 206 may be a higher-profile cage (relative to that of FIGS. 1A-1C), having a standard server rack configuration of two rack units ("2U"), which may be 19 inches wide and 3.5 inches tall.

In FIGS. 2A-2C, system board 204 of module cage 206 defines the plurality of receptacles 202-1 . . . 202-*n* for pluggable modules 200-1 . . . 200-*n*, and may also support computing circuitry 208, which may include processing circuitry, memory circuitry, switching circuitry, routing circuitry, or some combination thereof. In examples, system board 204 may be a PCB providing an EBL schematically identified with reference numeral 210 in FIGS. 2A-2C for providing an electrical interface between computing circuitry 208 and pluggable modules 200-1 . . . 200-*n* via respective receptacles 202-1 . . . 200-*n*.

In the example of FIGS. 2A-2C, each pluggable module 200-1 . . . 200-*n* may include side flanges 214-1 . . . 214-*n*, respectively. Module cage 206 may include a plurality of guide channels 216-1 . . . 216-*n* for receiving respective side flanges 214-1 . . . 214-*n* to guide respective pluggable modules 200-1 . . . 200-*n* into module cage 206 to an appropriate location corresponding to respective receptacles 202-1 . . . 202-*n*. In FIG. 2A, pluggable module 101-1 is installed first, with side flange 214-1 being advanced though guide channel 216-1 in the direction of arrow 218.

In the installation sequence depicted in FIGS. 2A-2C, front pluggable module 100-1 is the first to be inserted, with side flange 214-1 being advance through guide channel 116-1 in the direction of arrow 218. In the example of FIGS. 1A-1C, it is possible to install pluggable modules into respective slots in any order (i.e., front before back or vice versa), due to the increased height of the 2U module cage 206 relative to the 1U module cage in the example of FIGS. 1A-1C.

As shown in FIG. 2A, when pluggable module 200-1 is advanced to a location corresponding to receptacle 202-1, pluggable module 200-1 may be lowered into place at receptacle 202-1, as indicated by arrow 222. Similarly, as shown in FIG. 2B, when pluggable module 200-*n* is advanced to a location corresponding to receptacle 202-*n*, as indicated by arrow 220, pluggable module 200-*n* may be lowered into place at receptacle 202-*n*, as indicated by arrow 224.

As in the example of FIGS. 1A-1C, in the example of FIGS. 2A-2C, pluggable modules 202-1 . . . 202-*n* may be lowered into place at respective receptacles by various means, including mechanical means, electromagnetic systems, lead screw elevating systems, servo-motor systems, and the like, including various examples are described hereinbelow.

Figure 3A:
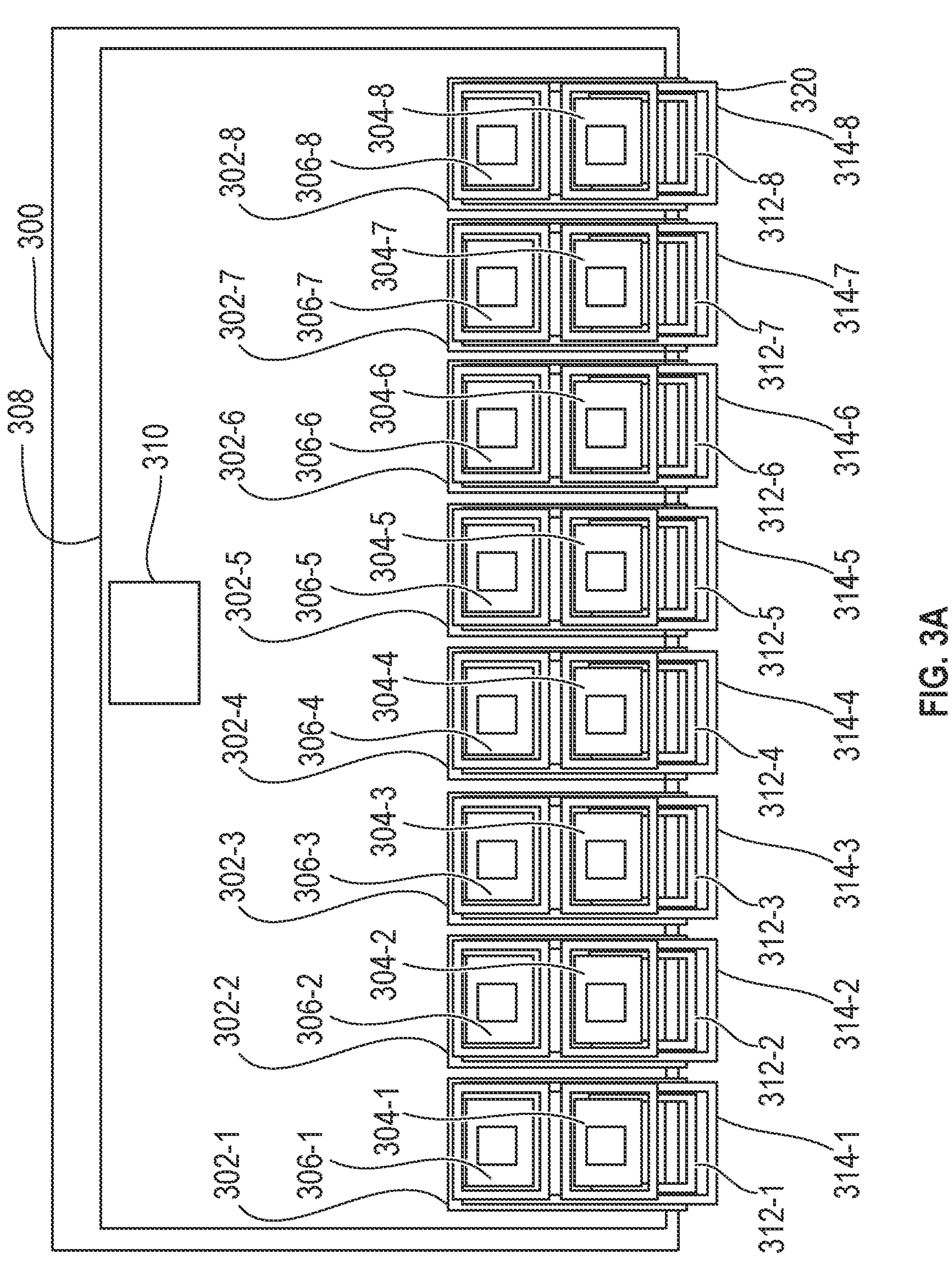
FIG. 3A is a top view illustrating a plurality of pluggable modules installed on receiving sockets on a system board according to one or more examples.

FIG. 3A is a top view of a module cage 300 with front pluggable modules 304-1 . . . 304-8 and rear pluggable modules 306-1 . . . 306-8 installed in a plurality of multi-module bays 302-1 . . . 302-8 according to another example. In the example of FIG. 3A, bays 302-1 . . . 302-8 are located on a system board 308 which also has computing circuitry 310 disposed thereon. As in the examples of FIGS. 1A-1B and FIGS. 2A-2C, computing circuitry 310 may include processing circuitry, memory circuitry, switching circuitry, routing circuitry, or some combination thereof.

In the example of FIG. 3A, front pluggable modules 304-1 . . . 304-8 are carried by respective front loader carrier brackets 312-1 . . . 312-8 which facilitate advancement of pluggable modules 304-1 . . . 304-8 through a front face 320 of module cage 300 for installation onto system board 308 at respective receptacles (not shown in FIG. 3A) in respective multi-module bays 302-1 . . . 302-8. Similarly, rear pluggable modules 306-1 . . . 306-8 are carried by respective rear loader carrier brackets 314-1 . . . 314-8 which facilitate advancement of pluggable modules 306-1 . . . 306-8 into module cage 300 for installation onto system board 308 at respective receptacles (not shown in FIG. 3A). Although the example of FIG. 3A has eight bays 302-1 . . . 302-8 each having two pluggable modules 304-1/306-1 . . . 304-8/306-8, in other examples more or fewer bays, each supporting more or fewer pluggable modules may be provided.

Figure 3B:
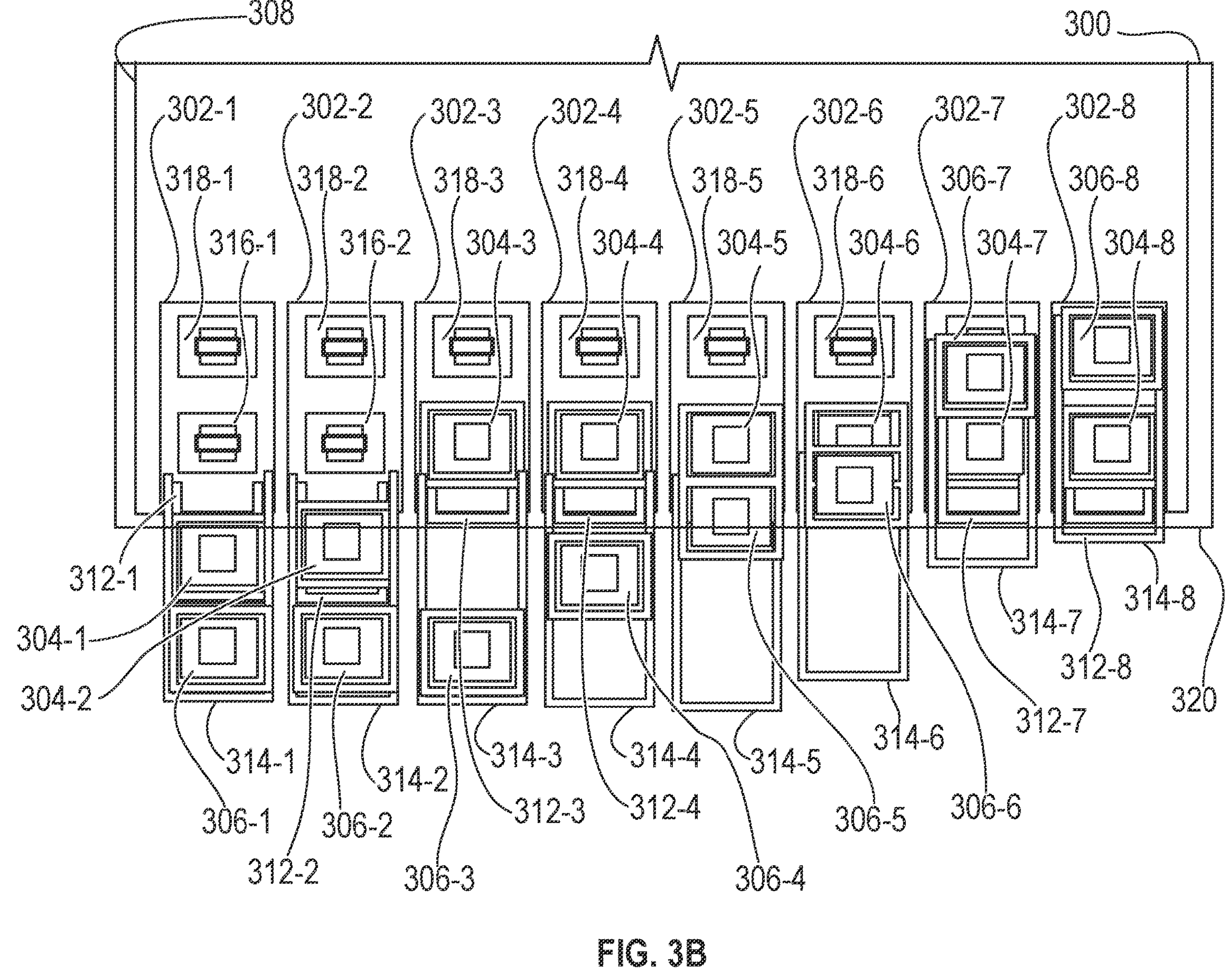
FIG. 3B is a top view illustrating the plurality of pluggable modules from FIG. 3A at a plurality of stages of installation on the system board of FIG. 3A.

FIG. 3B shows module cage 300 from the example of FIG. 3A with different pluggable modules in different multi-module bays 302-1 . . . 302-8 in various stages of installation into module cage 300. As shown in FIG. 3B, each multi-module bay 302-1 . . . 302-8 has a row of front receptacles 316-*x* and a row of rear receptacles 318-*x*. In FIG. 3B, front receptacles 316-1 and 316-2 are visible, with remaining front receptacles being obscured by pluggable modules being installed as described herein, whereas rear receptacles 318-1 through 318-6 are visible, with the remaining rear receptacles being obscured by pluggable modules as described herein.

In particular, in FIG. 3B, in multi-module bay 302-1, which includes front receptacle 316-1 and rear receptacle 318-*a*, front pluggable module 304-1 is loaded into front loader carrier bracket 312-1 and rear pluggable module 306-1 is loaded into rear loader carrier bracket 314-1, prior to loader carrier brackets 312-1 and 314-1 being advanced into module cage 300. In multi-module bay 302-2, front loader carrier bracket 312-2 and front pluggable module 304-2 have been advanced partially through front face 320 of module cage 300.

With continued reference to FIG. 3B, in multi-module bay 302-3, front loader carrier bracket 312-2 and front pluggable module 304-2 have been advanced to a position corresponding to front receptacle 316-2. In this position, front pluggable module 304-2 may be installed into position in front receptacle 316-2. In multi-module bay 302-4, rear pluggable module 306-4 has been partially advanced within rear installation carrier 314-4, prior to advancement of rear loader carrier bracket 314-4 into module cage 300. In multi-module bay 302-5, rear pluggable module 306-5 has been fully advanced to the rear of rear loader carrier bracket 314-5.

In multi-module bay 302-6, rear loader carrier bracket 314-6, with rear pluggable module 306-6 is partially advanced through the face 320 of module cage 300, beginning to pass overtop front module 304-6, which has been installed in receptacle 316-6 (not visible in FIG. 3B). In multi-module bay 302-7, rear loader carrier brackets 314-7, with rear pluggable module 306-7 has been further advanced through face 320 of module cage 300. Finally, in multi-module bay 302-8, rear loader carrier bracket 314-8 has been fully advanced into module cage 300, such that rear pluggable module 306-8 is situated in position over rear receptable 318-8 (not visible in FIG. 3B).

As in the examples of FIGS. 1A-1C and FIGS. 2A-2C, pluggable modules 304-1 . . . 304-8 and 206-1 . . . 306-8 in the example of FIGS. 3A and 3B may be lowered into place at respective receptacles by various means, including mechanical means, electromagnetic systems, lead screw elevating systems, servo-motor systems, and the like, including various examples are described hereinbelow.

Figure 4A:
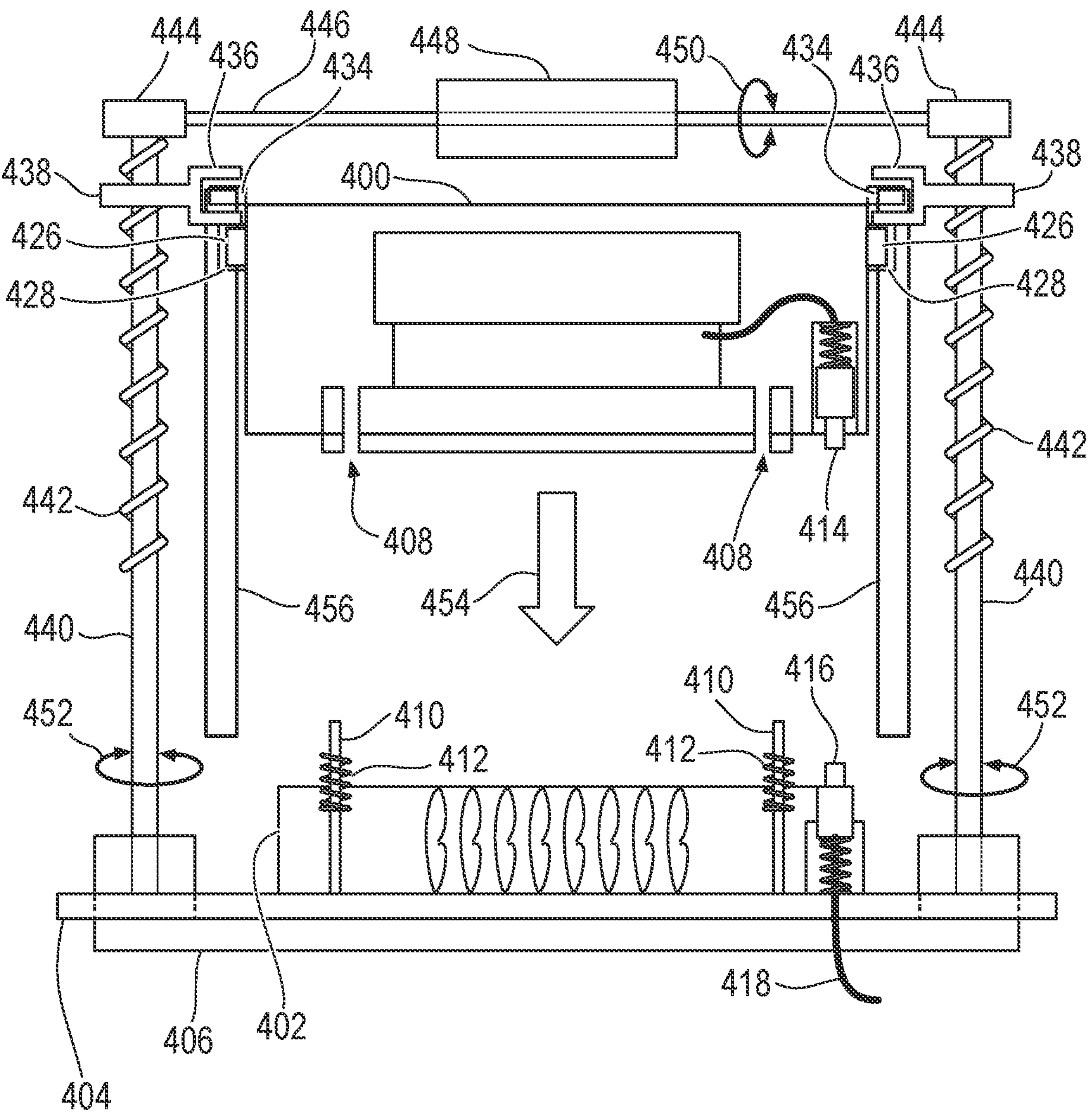
FIG. 4A is a front view illustrating a pluggable module prior to installation into a receiving socket on a system board according to one or more examples.
Figure 4B:
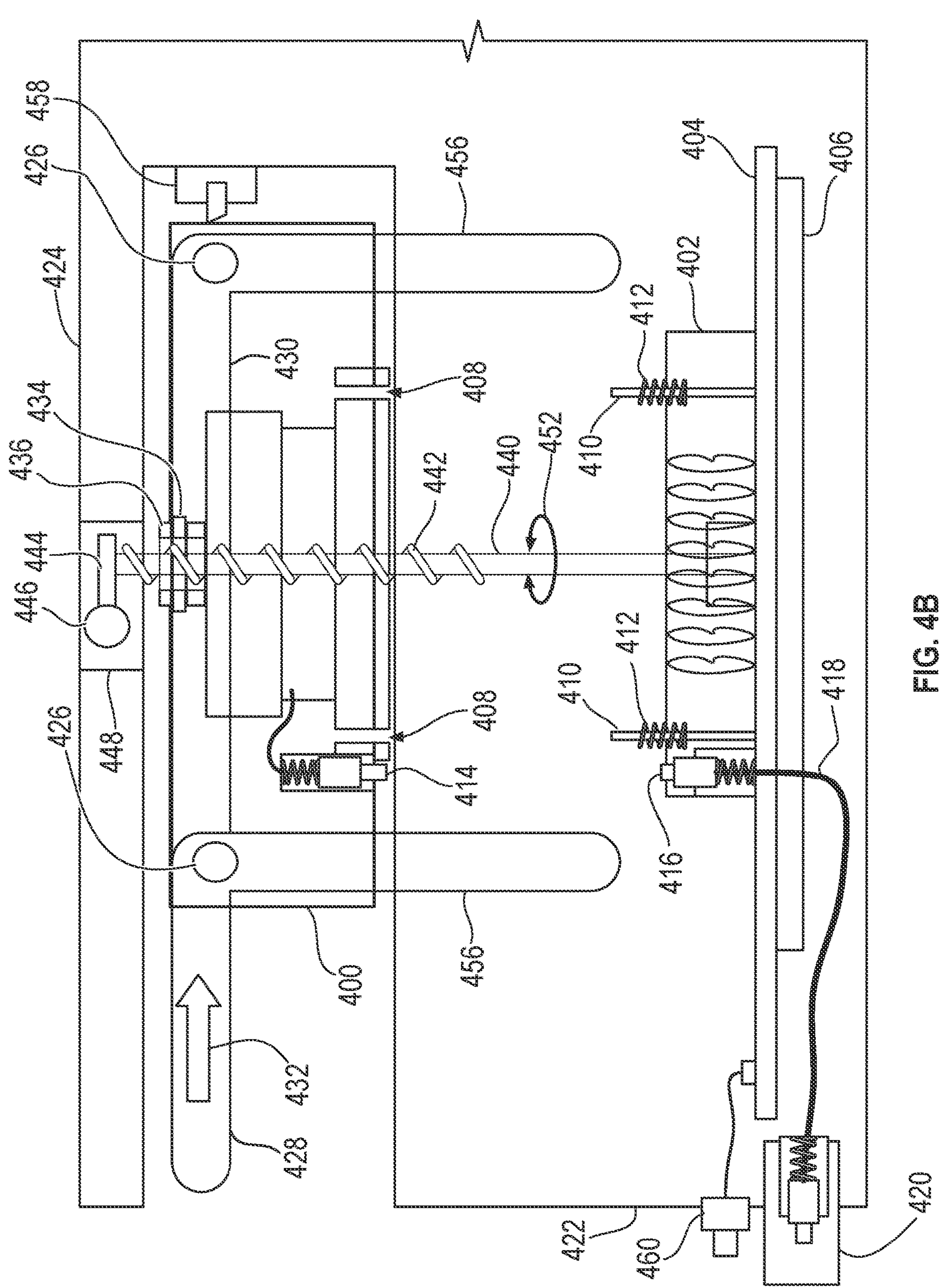
FIG. 4B is a side view illustrating the pluggable module of FIG. 4A prior to installation into a receiving socket on a system board according to one or more examples.

FIG. 4A is a front view of a pluggable module 400 adapted for installation in a receptacle 402 in accordance with another example. FIG. 4B is a side view of the pluggable module 400 and receptacle 402. In FIG. 4A, receptacle 402 is arranged on a system board 404 disposed on a base 406. Pluggable module 400 has a plurality of alignment sockets 408 therein adapted to receive a corresponding plurality of socket alignment pins 410 on receptacle 402. Dampening springs 412 may be provided on socket alignment pins 410 to dampen forces upon installation of pluggable module 400 in receptacle 402 as described herein. In this example, alignment of pluggable module 400 with receptacle 402 facilitates the blind-mate connection of an optical connector 414 on pluggable module 400 with an optical connector 416 on receptacle 402. Optical connector 416 on receptacle 402 connects with a fiber optic cable 418 to a faceplate optical connector 420 on faceplate 422 of a module cage 424 as shown in FIG. 4B.

As shown in FIGS. 4A and 48, pluggable module 400 has a plurality of rail guides 426 adapted to support pluggable module 400 within pairs of horizontal guide rails 428 and 430 to advance pluggable module 400 into module cage 424 as indicated by arrow 432 in FIG. 48. In FIG. 48, pluggable module 400 has been advanced along horizontal guide rails 428 and 430 to be situated in preparation for lowering into receptacle 402. In this position, an elevator tab 434 on each side of pluggable module 400 engages with an elevator claw 436 at the end of an elevator shelf 438.

Each elevator shelf 438 is engaged with a leadscrew elevator shaft 440 having leadscrew elevator threads 442 along the length thereof. Each leadscrew elevator shaft 440 has a worm gear 444 at an upper end thereof which is engaged with a worm drive shaft 446 driven by a worm drive motor 448. When worm drive motor 448 is activated to rotate worm drive shaft 446 as indicated by arrow 450 in FIGS. 4A and 4B, the engagement of worm drive shaft 446 with worm gears 444 causes rotation of leadscrew elevator shafts 440 as indicated by arrows 452 in FIGS. 4A and 4B. Due to the engagement of elevator shelves 438 with threads 442 of leadscrew elevator shafts 440, rotation of leadscrew elevator shafts 440 in a first direction causes elevator shelves 438 to be lowered, while rotation of leadscrew elevator shafts 440 in the opposite direction causes elevator shelves to be raised.

When elevator tabs 434 of pluggable module 400 are engaged with elevator shelf claws 436, when leadscrew elevator shafts 440 are rotated in the first direction, pluggable module 400 is carried downward toward receptacle 402, as indicated by arrow 454 in FIG. 4A. As pluggable module 400 is drawn downward, rail guides 426 of pluggable module 400 are guided along vertical guide rails 456.

In the example of FIGS. 4A-4D, a worm drive activation switch 458 may be provided within module cage 424. Worm drive activation switch 458 may be situated, as shown in FIG. 4B, such that worm drive activation switch 458 is actuated (e.g., closed) when pluggable module 400 is fully advanced into module cage 424 in the direction of arrow 432 in FIG. 4B. Actuation of worm drive activation switch 458 may activate worm drive motor 458 to automatically commence the lowering of pluggable module 400 in the direction of arrow 454.

Additionally, in the examples of FIGS. 4A-4D, a removal request switch 460 may be provided on faceplate 422 of module cage 424. Activation of removal request switch 460 may cause worm drive motor to commence raising of pluggable module 400 in the direction opposite of arrow 454, in cases where retrieval (e.g., removal or extraction) of pluggable module 400 is desired.

Figure 4C:
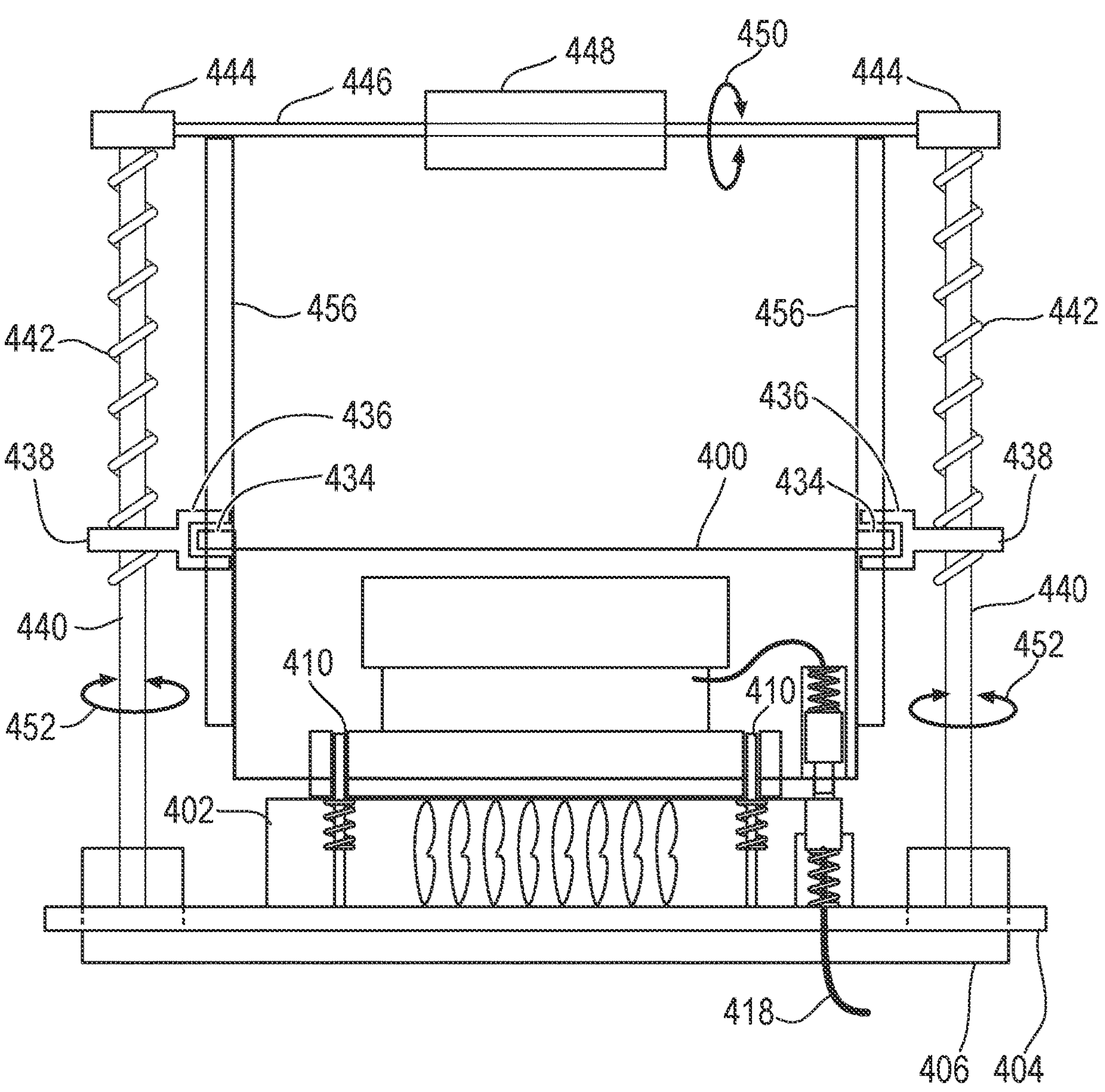
FIG. 4C is a front view of the pluggable module of FIG. 4A following installation into a receiving socket on a system board according to one or more examples.
Figure 4D:
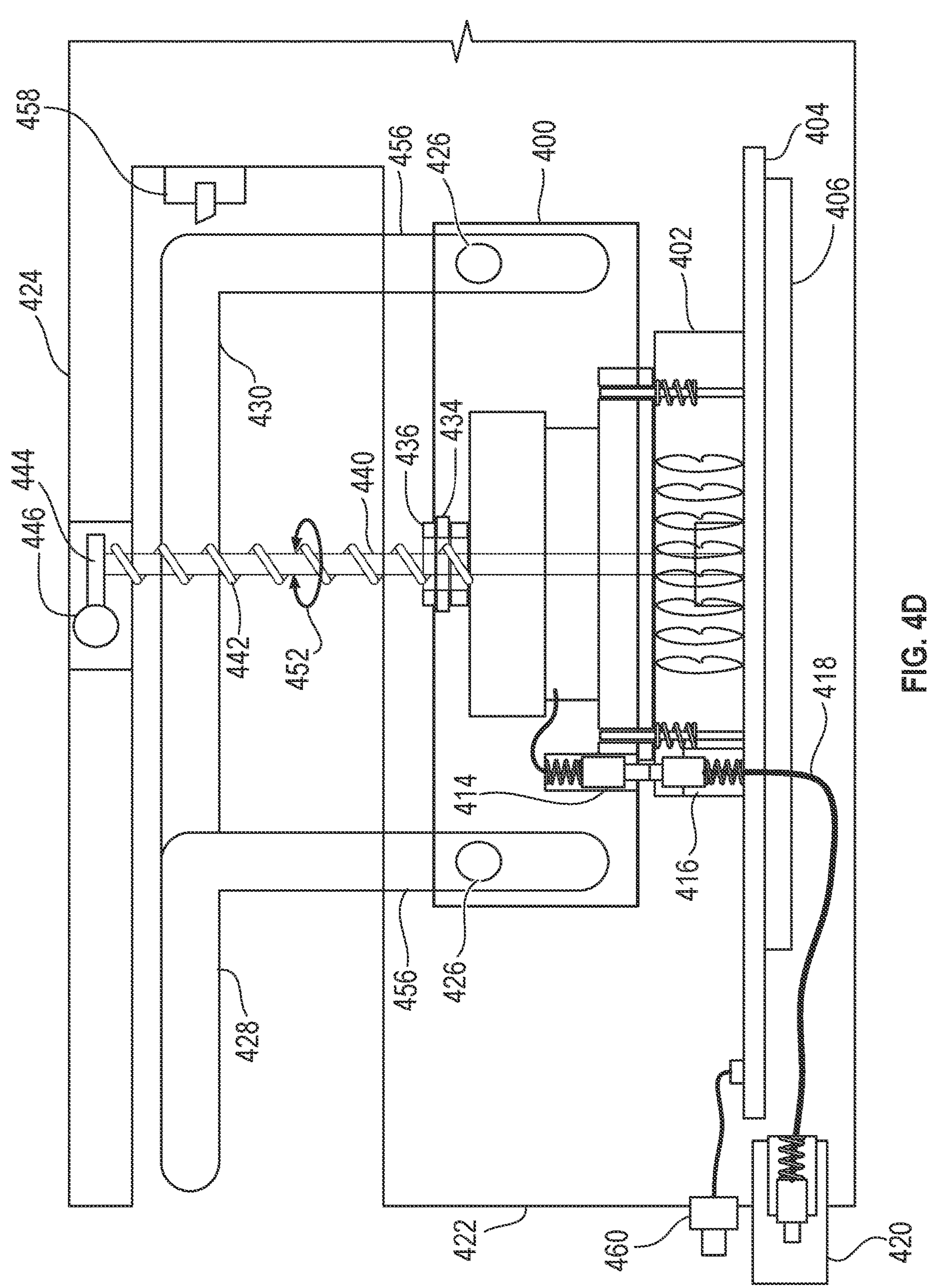
FIG. 4D is a side view illustrating the pluggable module of FIG. 4A following installation into a receiving socket on a system board according to one or more examples.

FIGS. 4C and 4D are front and side views, respectively, of pluggable module 400 and receptacle 402 after pluggable module 400 has been lowered by leadscrew shafts as described with reference to FIGS. 4A and 4B. As shown in FIGS. 4C and 4D, when pluggable module 400 is fully lowered, optical connectors 414 and 416 are mated, and alignment of pluggable module 400 is facilitated by engagement of socket engagement pins 410 of receptacle 402 with alignment sockets 408 of pluggable module 400.

Figure 5:
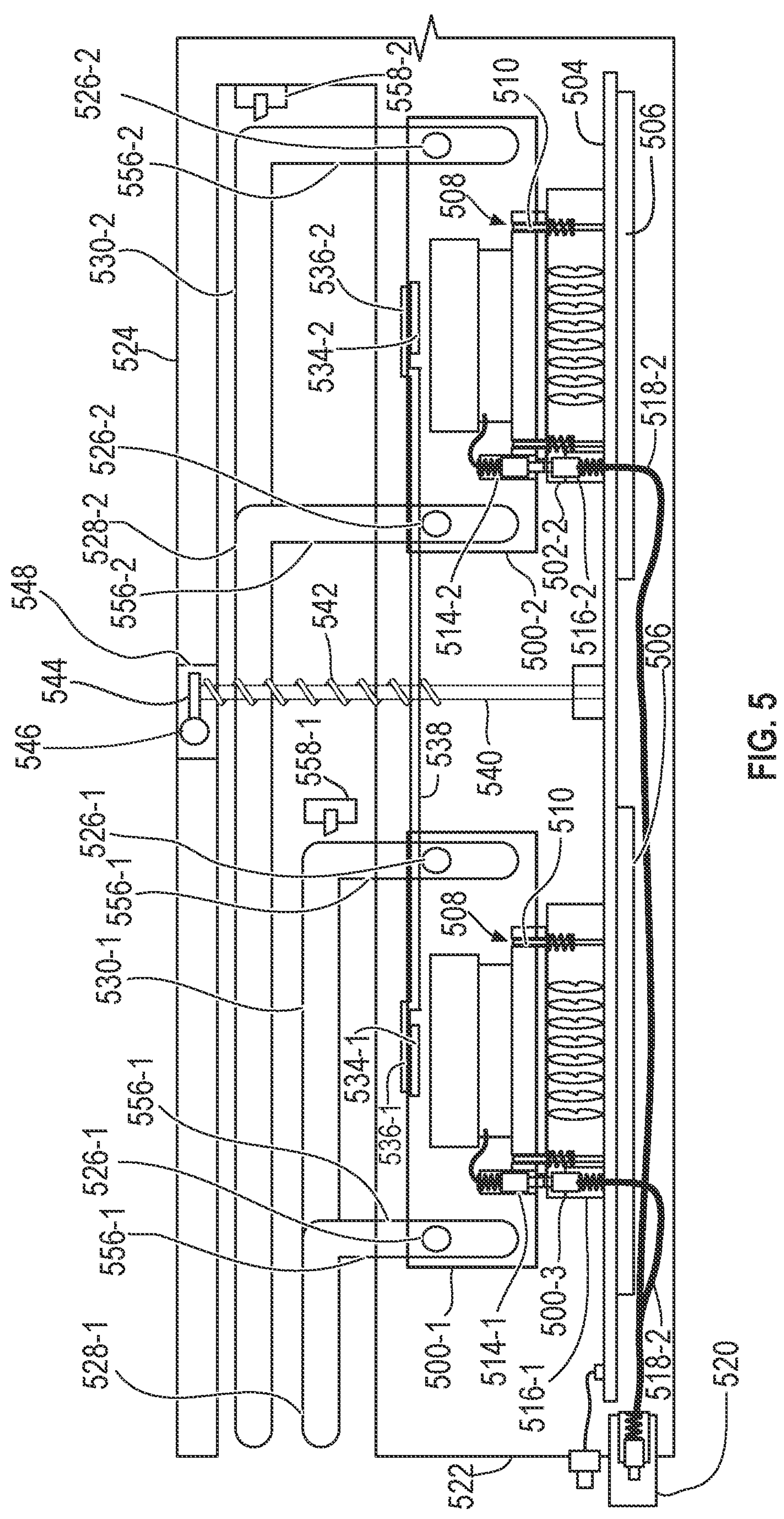
FIG. 5 is a side view of a pair illustrating pluggable modules following installation into a pair of receiving sockets on a system board according to one or more examples.

Turning to FIG. 5, there is shown an arrangement of a pair of pluggable modules (a front module 500-1 and a rear module 500-2) engaged with respective receptacles 502-1 and 502-2 in a manner similar to the arrangement described in the example of FIGS. 4A-4D. In the arrangement of FIG. 5, an opposing pair of common leadscrew elevator shafts 540 (only one being shown in FIG. 5) with threads 542 operate to simultaneously raise and lower both front module 500-1 and rear module 500-2 via a pair of common elevator shelves 538 engaged with threads 542 of common leadscrew elevator shafts 540 having two opposing elevator shelf pads 536-1 and 536-2. In some examples, elevator shelf pads 536-1 and 536-2 may be electromagnetically attractive to respective elevator tabs 534-1 and 534-2 on modules 500-1 and 500-2.

Common elevator shelf 538 may push down module 500-2 at a higher elevation first, and subsequently push down module 500-1 at a lower elevation. Following installation, of modules 500-1 and 500-2, common elevator shelf 538 may continue to engage with both modules 500-1 and 500-2. In examples, other module retention features may be provided on system board 504 to securely retain the modules in the respective sockets. For removal of modules 500-1 and 500-2, such module retention features may be deactivated to release modules 500-1 and 500-2, such that raising of common elevator shelf 538 lifts up modules 500-1 and 500-2 simultaneously. Module 500-1 will stop first when it contacts rail guide 530-1 and elevator shelf pad 53601 disengages from module 500-1 and continue to rise. Similarly, elevator shelf pad 534-2 disengages from module 500-2 upon contacting rail guide 530-2, and continue to rise to free of module 500-2.

In some examples, where module 500-1 or 500-2 is to be removed selectively, magnetic pads 536-1 536-2 may be selectively energized by a module selection mechanism. A module selection mechanism may for user selection of the desired module 500-1 or 500-2 to be removed.

As shown in FIG. 5, front pluggable module 500-1 has a pair of rail guides 526-1 on each side for riding in front horizontal rail guides 528-1 and 530-1, and in front vertical rail guides 556-1, while rear pluggable module 500-2 has a pair rail guides 526-2 on each side for riding in rear horizontal rail guides 528-2 and 530-2, and in rear vertical rail guides 556-2.

In the example of FIG. 5, pluggable modules 500-1 and 500-2 have a plurality of alignment sockets 508 therein adapted to receive a corresponding plurality of socket alignment pins 510 on receptacles 502-1 and 502-2. Alignment of pluggable modules 500-1 and 500-2 with receptacles 502-1 and 502-2 facilitates the blind-mate connection of respective optical connectors 514-1 and 514-2 on pluggable modules 500-1 and 500-2 with respective optical connectors 516-1 and 516-2 on receptacles 502-1 and 502-2. Optical connectors 516-1 and 516-2 on receptacles 502-1 and 502-2 connect with respective fiber optic cables 518-1 and 518-2 to a faceplate optical connector 520 on faceplate 522 of a module cage 524 as shown in FIG. 5.

As shown in FIG. 5, pluggable module 500-1 has a plurality of rail guides 526-1 adapted to support pluggable module 500-1 within pairs of horizontal guide rails 528-1 and 530-1 to advance pluggable module 500-1 into module cage 524. Similarly, pluggable module 500-2 has a plurality of rail guides 526-2 adapted to support pluggable module 500-2 within pairs of horizontal guide rails 528-2 and 530-2 to advance pluggable module 500-2 into module cage 524. In FIG. 5, pluggable modules 500-1 and 500-2 have each been advanced along respective horizontal guide rails 528-1, 528-2 and 530-1, 530-2 to be situated in preparation for lowering into respective receptacles 502-1 and 502-2. In this position, an elevator tab 534-1 on module 500-1 and an elevator tab 534-2 on each side of respective pluggable modules 500-1 and 500-2 may engage with respective elevator pads 536-1 and 526-2 at the end of common elevator shelf 538. As noted above, such engagement of elevator pads 536-1 and 536-2 with respective elevator tabs 534-1 and 534-2 may be electromagnetic.

Each common elevator shelf 538 is engaged with a leadscrew elevator shaft 540 having leadscrew elevator threads 542 along the length thereof. Each leadscrew elevator shaft 540 has a worm gear 544 at upper end thereof which is engaged with a worm drive shaft 546 driven by a worm drive motor 548. When worm drive motor 548 is activated to rotate worm drive shaft 546, the engagement of worm drive shaft 546 with worm gears 544 causes rotation of leadscrew elevator shafts 540. Due to the engagement of common elevator shelves 538 with threads 542 of leadscrew elevator shafts 540, rotation of leadscrew elevator shafts 540 in a first direction causes common elevator shelves 538 to be lowered, while rotation of leadscrew elevator shafts 540 in the opposite direction causes elevator shelves to be raised.

When elevator tabs 534-1 and 534-2 of respective pluggable modules 500-1 and 500-2 are engaged with respective elevator pads 536-1 and 536-2 rotation of leadscrew elevator shafts 540 in the first direction causes pluggable modules

500-1 and 500-2 to be pushed downward toward respective receptacles 502-1 and 502-2. As pluggable modules 500-1 and 500-2 are pushed downward, rail guides 526-1 and 526-2 of respective pluggable modules 500-1 and 500-2 are guided along respective vertical guide rails 556-1 and 556-2.

In the example of FIG. 5, a pair of worm drive activation switches 558-1 and 558-2 may be provided within module cage 424. Worm drive activation switches 558-1 and 558-2 may be situated, as shown in FIG. 4B, such that worm drive activation switch 558-1 is actuated (e.g., closed) when pluggable module 500-1 is fully advanced into module cage 524, and worm drive activation switch 558-2 is actuated (e.g., closed) when pluggable module 500-2 is fully advanced into module cage 524. Actuation of one or both of worm drive activation switches 558-1 and 558-2 may activate worm drive motor 558 to automatically commence the lowering of pluggable modules 500-1 and 500-2 toward respective receptacles 502-1 and 502-2.

Additionally, in the examples of FIG. 5, a removal request switch 560 may be provided on faceplate 522 of module cage 524. Activation of removal request switch 560 may cause worm drive motor to commence raising of pluggable modules 500-1 and 500-2 in the direction opposite of arrow 554, in cases where retrieval of pluggable modules 500-1 and 500-2 is desired.

Figure 6A:
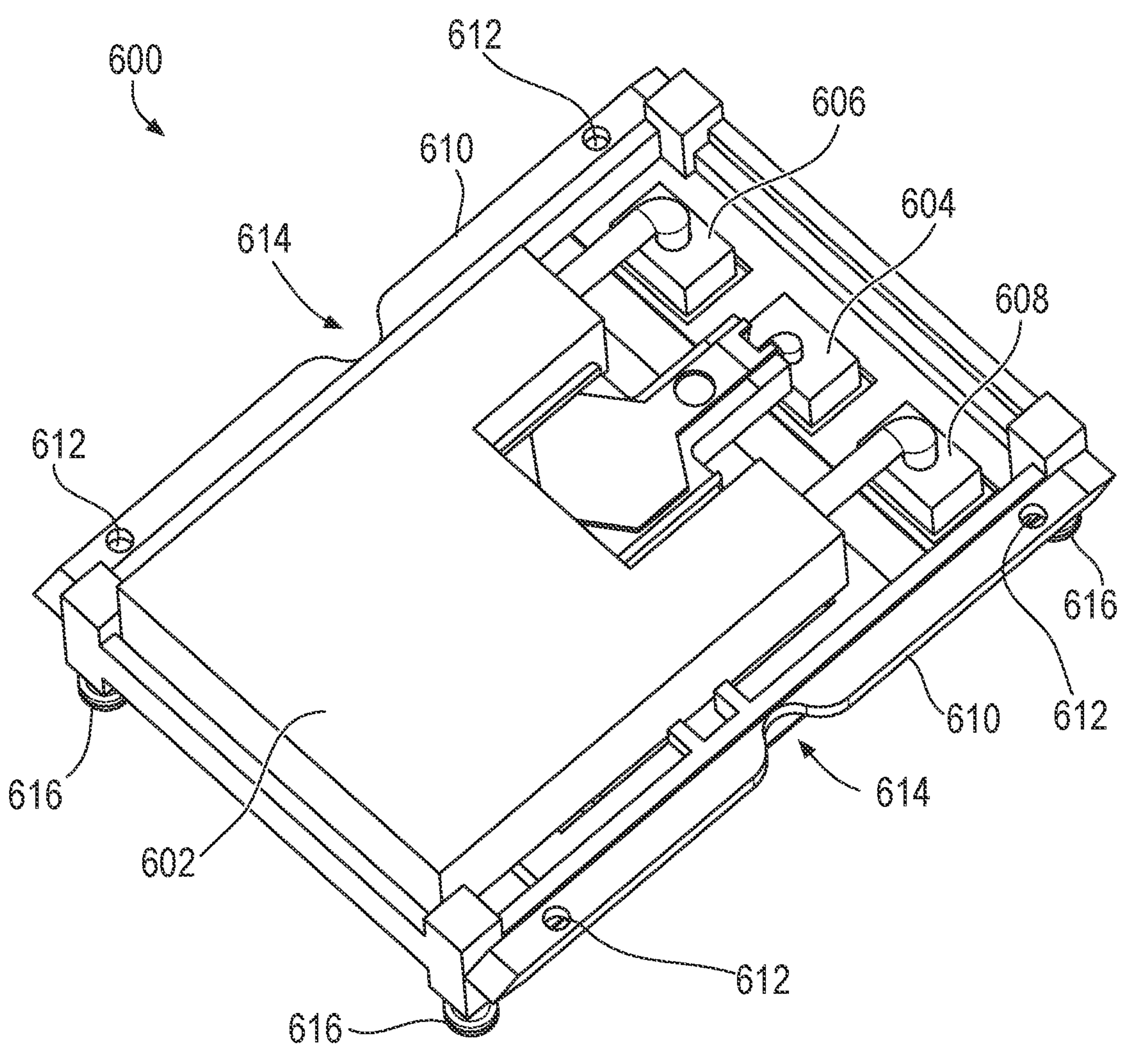
FIG. 6A is a top isometric view illustrating a pluggable module according to one or more examples.
Figure 6B:
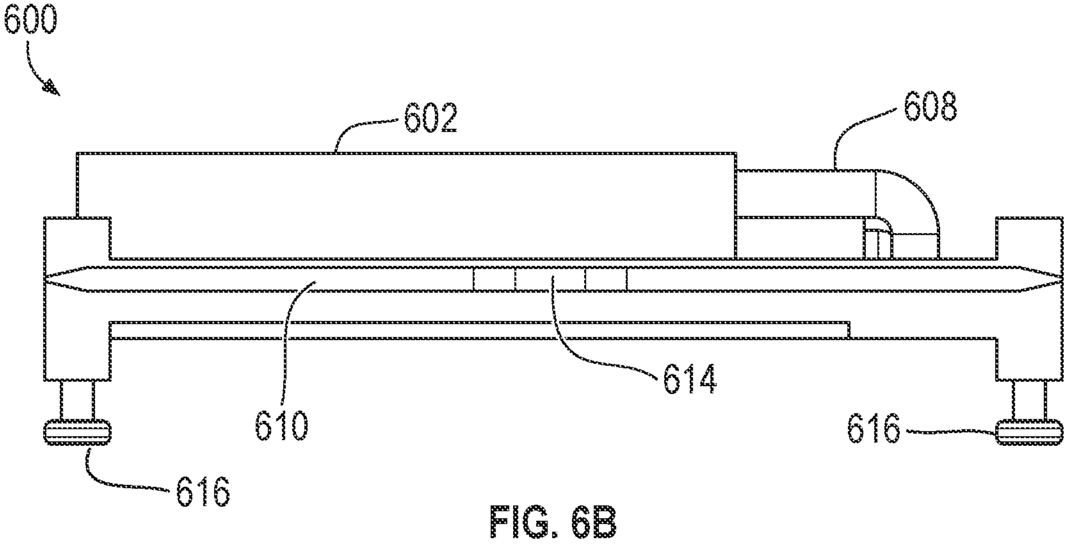
FIG. 6B is a side isometric view illustrating the pluggable module of FIG. 6A.
Figure 6C:
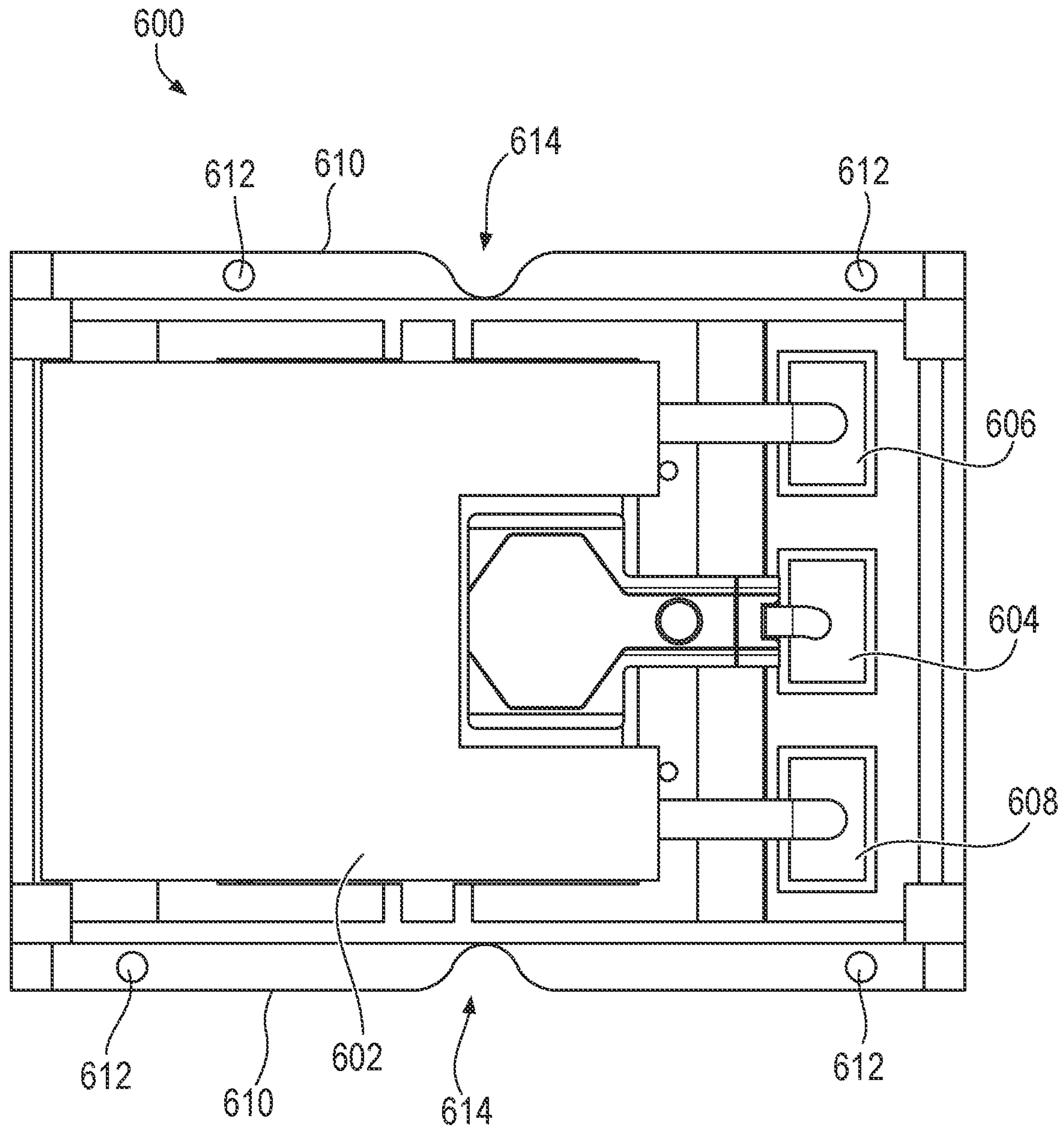
FIG. 6C is a top view illustrating the pluggable module of FIG. 6A.

FIG. 6A is a top isometric view of a pluggable module 600 according to one or more further examples. FIG. 68 is a side view of the pluggable module 600 from FIG. 6A; FIG. 6C is a top view of the pluggable module 600 from FIG. 6A; and FIG. 6D is a bottom isometric view of the pluggable module 600 from FIG. 6A.

As shown in FIGS. 6A-6D, in some examples, pluggable module 600 may include optical transceiver circuitry 602 to interface with computing circuitry on a system board as herein described. Pluggable module may also include a blind-mate optical connector 604, a blind-mate liquid cooling connector 606, and a blind-mate electrical connector 608, each for connecting to corresponding blind-mate connectors on a system board.

As further shown in FIGS. 6A-6D, pluggable module 600 is configured to have an opposing pair of side flanges 610 with holes 612 for engaging with snap connectors on a loader carrier bracket as hereinafter described. Flanges 610 each further include a notch 614 to allow clearance for leadscrew loading shafts, also to be hereinafter described. Further, pluggable module 600 in the example of FIGS. 6A-6D includes a plurality of module feet 616 to facilitate securing of pluggable module onto a system board.

Figures 6D, 7:
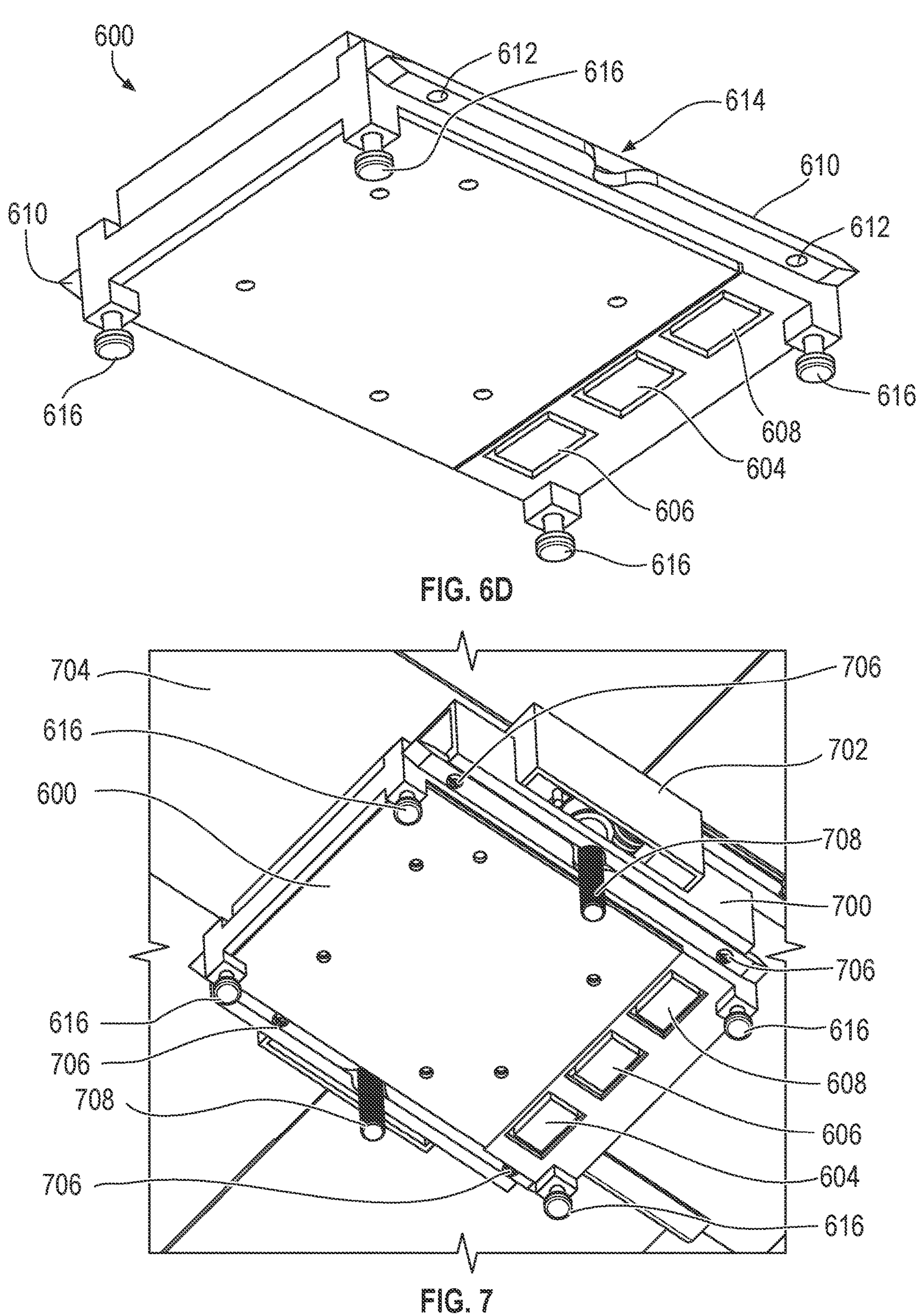
FIG. 6D is a bottom isometric view illustrating the pluggable module of FIG. 6A.
FIG. 7 is bottom isometric view illustrating the pluggable module of FIG. 6A carried by a carrier bracket of a carrier assembly attached to a module loading arm according to one or more examples.

FIG. 7 is a bottom isometric view of pluggable module 600 being carried by a loader carrier bracket 700 which cooperates with a module loader 702 to install pluggable module 600 onto a system board. Module loader 702 is carried by a module loading arm 704 used to advance pluggable module 600 into a module cage as herein described.

In this example, pluggable module 600 is detachably coupled to loader carrier bracket 700 with snap connectors 706 which extend through holes 612 in pluggable module shown in FIGS. 6A-6D. Loader carrier bracket 700 is engaged with an opposing pair of leadscrews 708 which, when rotated in one direction, drive loader carrier bracket 700 and pluggable module 600 away from module loader 702. Notches 614 in flanges 610 of pluggable module 600 permit clearance for leadscrews 708 which extend downwardly from module loader 702. Feet 616 provide a locking mechanism to work in conjunction with a sliding locking handle system to secure, after lowering, pluggable module 600 into place, as described in further detail below with reference to FIGS. 12A-12C and 13A-13D.

Figure 8:
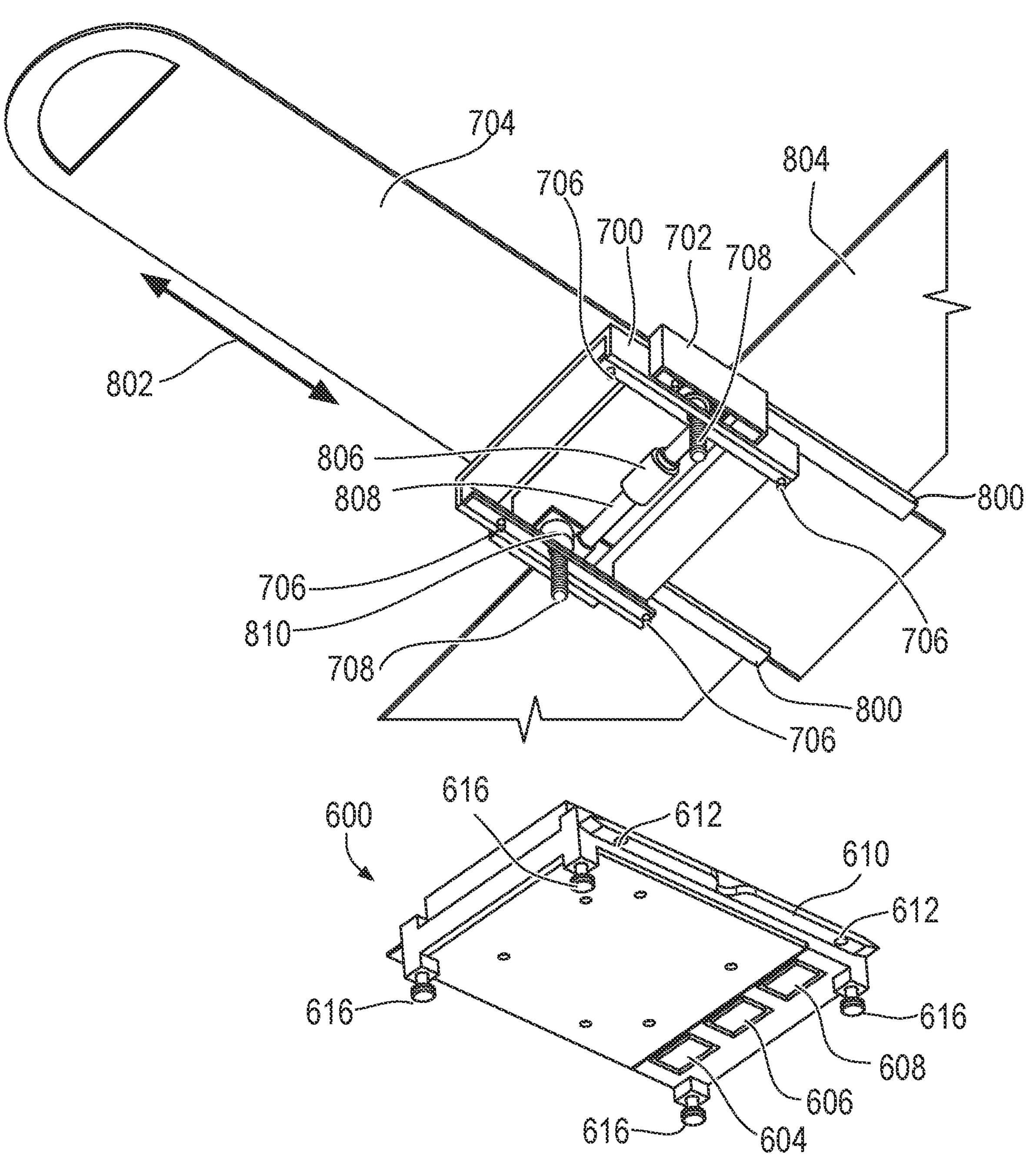
FIG. 8 is a bottom exploded isometric view illustrating the pluggable module, carrier bracket, carrier assembly, and module loading arm of FIG. 7.

FIG. 8 is an exploded bottom isometric view of module loading arm 704, module loader 702, loader carrier bracket 700, and pluggable module 600 according to the present example. As shown in FIG. 8, module loading arm is adapted to slide within an opposing pair of channels 800 as indicated by arrow 802 in FIG. 8. Channels 800 may be disposed on the underside of an upper surface 804 of a module cage.

As shown in FIG. 8, module loader 702 contains a worm drive motor 806 for rotating a worm drive shaft 808 engaged at each end to a worm gear at an end of each leadscrew 708. With this arrangement, rotation of worm drive shaft 808 by worm drive motor 806 causes rotation of leadscrews 708 to raise or lower loader carrier bracket 700.

Figure 9:
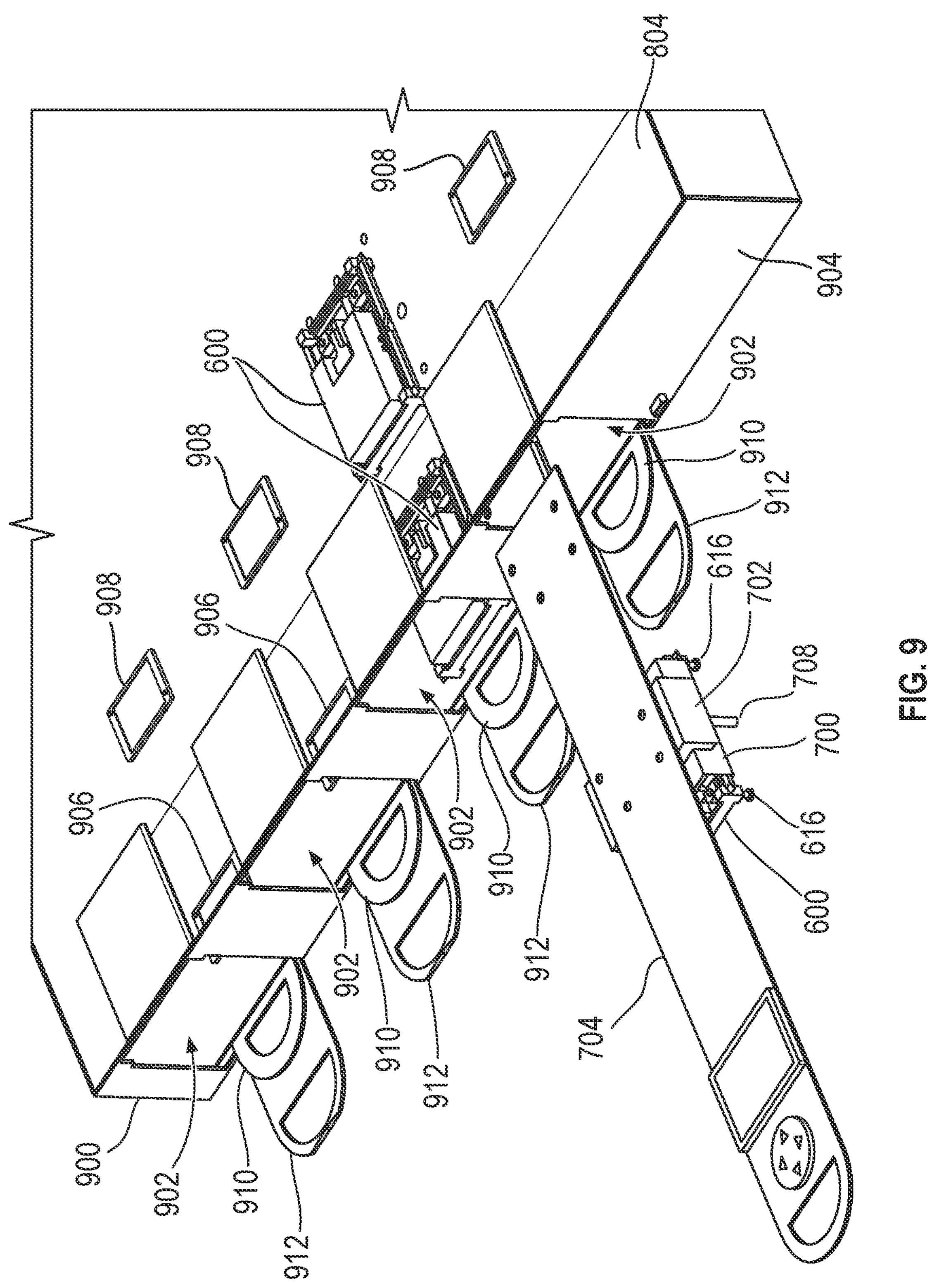
FIG. 9 is a front top isometric view illustrating the pluggable module, carrier bracket, carrier assembly, and module loading arm of FIG. 7 before being advanced into a module cage according to one or more examples.

FIG. 9 is a top isometric view of a module cage 900 of which the upper surface 804 is shown in FIG. 8. As shown in FIG. 9, module cage 900 includes a plurality of multi-module bays 902 accessible through a front face 904 of module cage 900. In this example, each multi-module bay 902 has a front module receptacle and a rear module receptacle. In FIG. 9, two front receptacles 906 are partially visible and three rear receptacles 908 are visible. Also in FIG. 9, two installed pluggable modules 600 are shown. It is noted that in other examples, more than two receptacles may be provided in each multi-module bay 902.

In this example, each multi-module bay 902 has a front locking handle 910 and a rear locking handle 912 which serve to secure pluggable modules in place within module cage 900 as described hereinbelow. In FIG. 9, a module loading arm 704 is shown prior to being advanced into module cage 900 for installation of a pluggable module 600 carried by a module loader 702 and loader carrier bracket 700.

Figure 10:
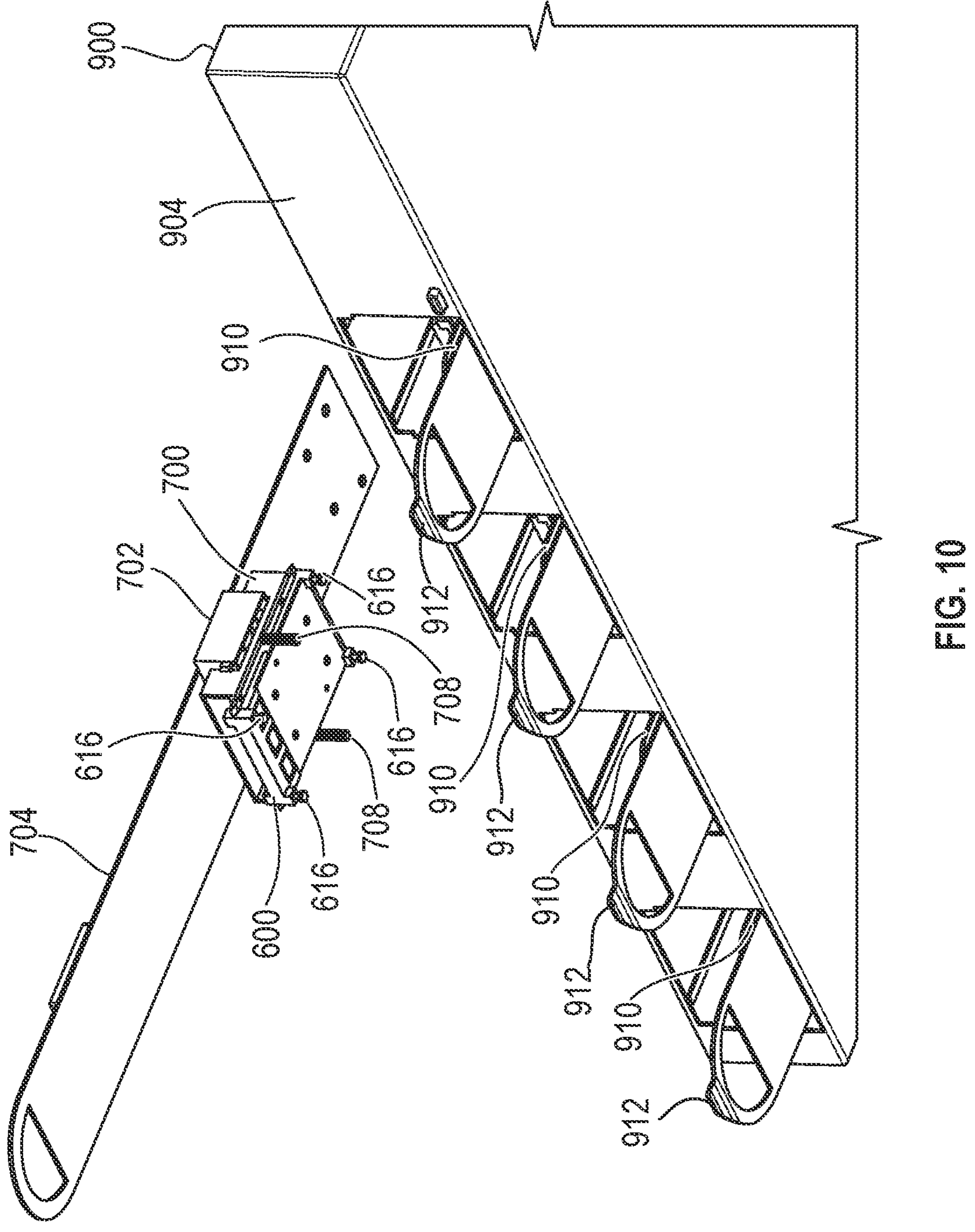
FIG. 10 is a front bottom isometric view illustrating the pluggable module, carrier bracket, carrier assembly, and module loading arm of FIG. 7 before being advanced into a module cage according to one or more examples.

FIG. 10 is a bottom isometric view of the module cage 900 from FIG. 9. Again, module loading arm 704 is shown prior to being advanced into module cage 900.

Figure 11:
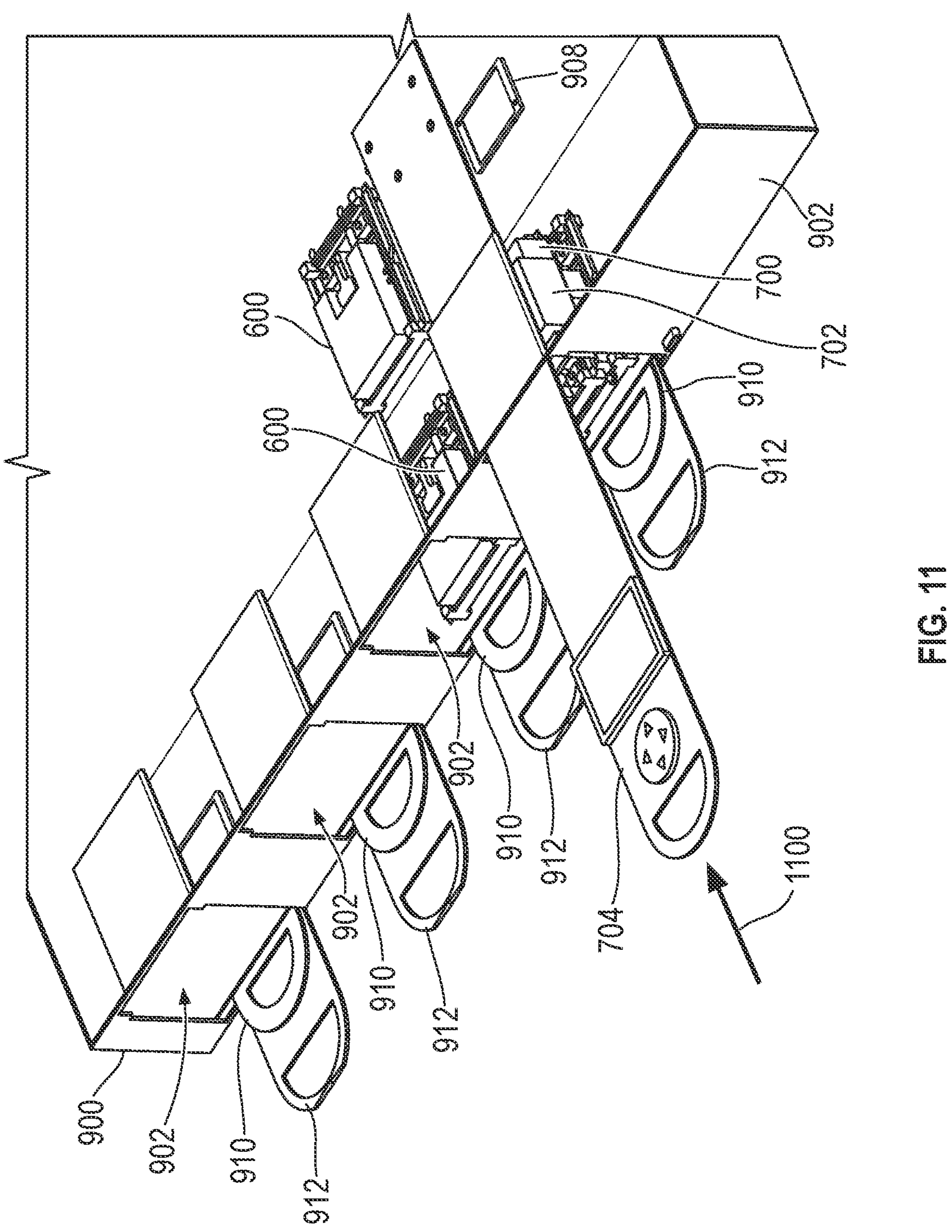
FIG. 11 is a front top isometric view illustrating the pluggable module, carrier bracket, carrier assembly, and module loading arm of FIG. 7 after being at least partially advanced into a module cage according to one or more examples.

FIG. 11 is a top isometric view of the module cage 900 from FIG. 9. In FIG. 11, module loading arm 704 has been partially advanced into module cage 900, in the direction indicated by arrow 1100. This advances module loader 702 and module carrier bracket 700 toward rear receptacle 908 shown in FIG. 11. In some examples, an automated mechanism, such as a robotic manipulator with an effector adapted to engage module loading arm 704, may be provided to advance module loader 702 and module carrier bracket 700 toward rear receptacle 908. In other examples, advancing module loader 702 may be performed manually, i.e., by a human operator.

Figures 12A, 12B, 12C:
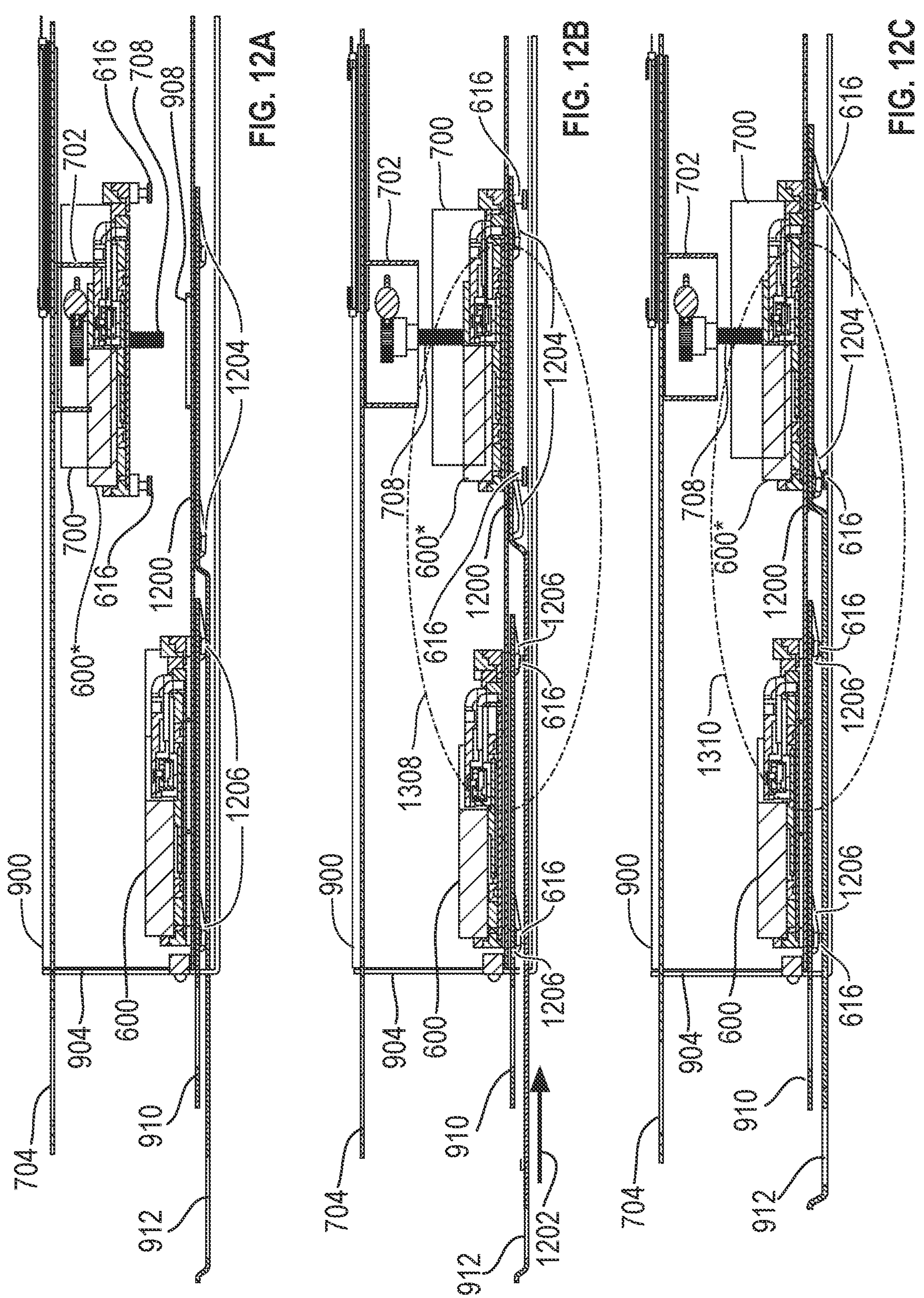
FIGS. 12A, 12B, and 12C are side views illustrating a sequence of installing a pluggable module onto a rear socket of system board in a module cage according to one or more examples.

FIGS. 12A, 12B, and 12C are side views of module cage 900 from FIG. 9 showing a sequence of installing and securing a pluggable module 600 therein. In particular, in FIG. 12A, a front pluggable module 600 has already been installed onto a system board 1202. A pluggable module 600*, which is carried by loader carrier bracket 700 of module loader 702, is shown in the process of being installed. In particular, in FIG. 12A, pluggable module 600* has been advanced by module loading arm 704 to a position over rear receptacle 908 located on system board 1200 within module cage 900.

In FIG. 12B, module loader 702 has been actuated to rotate leadscrews 708 to lower module 600* onto system board 1200. System board 1200 may be provided with holes corresponding to module feet 616 to allow module feet 616 to extend through system board 1200 as shown in FIG. 12B.

Next, to secure module 600* in placed on system board 1200, bottom locking handle 912 is advanced inwardly as indicated by arrow 1202 in FIG. 12B. As shown in FIG. 128, bottom locking handle 912 is provided with locking features 1204 adapted to engage with module feet 616 when locking handle 912 is advanced in the direction of arrow 1202. FIG. 12B shows bottom locking handle 912 prior to locking features.

As shown in FIGS. 12A-12C, similar locking features 1206 are provided on front locking handle 910 for securing a front pluggable module 600. As shown in FIGS. 12A-12C, front locking handle 910 is situated above rear locking handle 912.

Following the securing of pluggable module 600* onto system board 1200, module loader 702 may be actuated to withdraw loader carrier bracket 700 with sufficient force to release the snap connection between loader carrier bracket 700 and pluggable module 600*. Thereafter, module loading arm, with loader carrier bracket 700 and module loader 702 may be withdrawn from module cage 900.

Figures 13A, 13B, 13C, 13D:
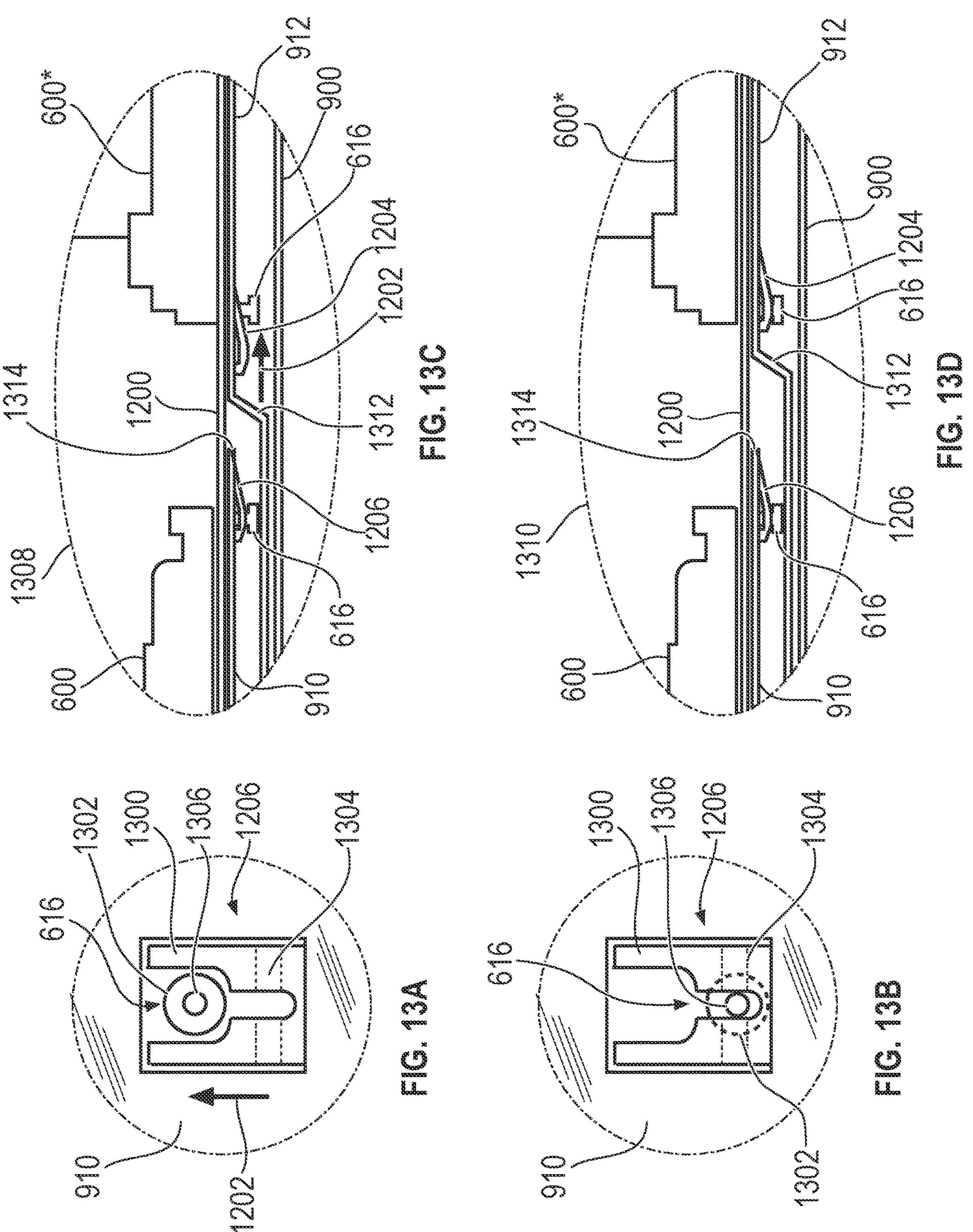
FIG. 13A is a top view illustrating a locking handle locking feature according to one or more examples prior to engagement with a foot of a pluggable module.
FIG. 13B is a top view illustrating the locking handle locking feature of FIG. 13A following engagement with a foot of a pluggable module.
FIG. 13C is an enlarged portion of FIG. 12B.
FIG. 13D is an enlarged portion of FIG. 12C.

FIG. 13A is a top view of a typical locking feature 1206 on front locking handle 910. In this example, locking features 1204 of rear locking handle 912 are identical to locking features 1206 of front locking handle 910. Locking feature 1206 in FIG. 13A is shown prior to engagement with a pluggable module foot 616. As shown in FIG. 13A, locking feature 1206 includes a wider front portion 1300 which permits passage of a flared end portion 1302 of pluggable module foot 616 therethrough. Locking feature 1206 further includes a narrower rear portion 1304 which permits passage of a shaft portion 1306 of pluggable module foot 616 therethrough.

FIG. 13B shows locking feature 1206 after engagement with pluggable module foot 616 caused by sliding of locking handle 910 forward in the direction of arrow 1202 as previously described with reference to FIG. 12B. In the engaged position of FIG. 13B, flared end portion 1302 of pluggable module foot 616 is restricted from passing through narrower rear portion 1304 of locking feature 1206, thereby securing pluggable module 600 (not shown in FIGS. 13A and 13B.

FIG. 13C is an enlarged side view of the portion of FIG. 12B shown within dashed line 1308. In the view of FIG. 13C, a pluggable module foot 616 of front pluggable module 600 is engaged by locking feature 1206 of front locking handle 910. Also in FIG. 13C, a pluggable module foot 616 of rear pluggable module 600* is not yet engaged by locking feature 1204 of bottom locking handle 912, since locking handle 912 has not been advanced in the direction of arrow 1202 in FIG. 13C.

As shown in FIG. 13C, rear locking handle 912 includes an upward vertical deflection 1312 beyond a forward end 1314 of front locking handle 910. Upward vertical deflection 1312 enables front locking handle 912 and rear locking handle 910 to be arranged in layers, with rear locking handle 912 passing beneath front locking handle 910. Upward vertical deflection 1312 enabling locking feature 1203 to engage with pluggable module foot 616 of rear pluggable module 600* disposed in a row behind front pluggable module 600.

In various examples, more than two layered locking handles may be provided for a multi-module bay containing more than two rows of pluggable modules 600. In such examples, each successive locking handle may have an upward vertical deflection enabling multiple layers of locking handles to pass over one another as shown in FIG. 13C.

In FIG. 13D, rear locking handle 912 has been advanced as indicated by arrow 1202 in FIG. 13C, such that locking feature 1204 of rear locking handle 912 is engaged with a pluggable module foot 616 of rear pluggable module 616*. Engagement of pluggable module foot 616 by locking feature 1204 secures pluggable module 606* to system board 1200. (For clarity, receptacle 908 for pluggable module 908, previously described with reference to FIG. 12A, is not shown in FIGS. 13C and 13D.)

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method of installing a pluggable module onto a system board, the method, comprising:

attaching the pluggable module to a loader carrier bracket;

causing insertion of the loader carrier bracket into a module cage containing the system board, the module cage having a front face, the insertion positioning the loader carrier bracket above a first row of pluggable module receptacles on the system board, the first row of pluggable module receptacles extending parallel to a second row, relative to the front face of the module cage, of pluggable module receptacles on the system board;

initiating lowering of the loader carrier bracket onto a pluggable module receptacle of the first row of pluggable module receptacles;

sliding a locking handle of the module cage, after the lowering, toward the loader carrier bracket, to restrict movement of the pluggable module in a direction opposite the lowering; and establishing communicative coupling between the pluggable module and the system board.

2. The method of claim 1, wherein the first row of pluggable module receptacles extends behind the second row of pluggable module receptacles, relative to the front face of the module cage.

3. The method of claim 1, wherein the lowering of the loader carrier bracket is performed by rotation of at least one leadscrew coupled to the loader carrier bracket.

4. The method of claim 1, further comprising:

initiating raising of the loader carrier bracket after restricting movement of the pluggable module in the direction opposite the lowering, the raising of the loader carrier bracket causing detachment of the pluggable module from the loader carrier bracket.

5. The method of claim 1, wherein the sliding of the locking handle causes at least one locking feature of the locking handle to engage with at least one foot of the pluggable module.

6. The method of claim 3, wherein the rotation of the leadscrew is driven by a worm drive shaft coupled to a worm gear on the at least one leadscrew.

7. The method of claim 1, wherein establishing communicative coupling between the pluggable module and the system board is accomplished via at least one blind-mate connection.

8. The method of claim 1, wherein sliding the locking handle toward the loader carrier bracket comprises sliding the locking handle in the direction of insertion of the loader carrier bracket.

* * * * *